United States Patent
Willmeroth et al.

(10) Patent No.: US 9,484,400 B2
(45) Date of Patent: Nov. 1, 2016

(54) METHOD OF FORMING A SUPER JUNCTION SEMICONDUCTOR DEVICE HAVING STRIPE-SHAPED REGIONS OF THE OPPOSITE CONDUCTIVITY TYPES

(71) Applicant: Infineon Technologies Austria AG, Villach (AT)

(72) Inventors: Armin Willmeroth, Augsburg (DE); Franz Hirler, Isen (DE); Hans Weber, Bayerisch Gmain (DE); Markus Schmitt, Neubiberg (DE); Thomas Wahls, Munich (DE); Rolf Weis, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/878,565

(22) Filed: Oct. 8, 2015

(65) Prior Publication Data
US 2016/0104768 A1    Apr. 14, 2016

Related U.S. Application Data

(63) Continuation of application No. 13/664,924, filed on Oct. 31, 2012, now Pat. No. 9,184,277.

(51) Int. Cl.
*H01L 29/06* (2006.01)
*H01L 29/78* (2006.01)
(Continued)

(52) U.S. Cl.
CPC ......... *H01L 29/0634* (2013.01); *H01L 21/225* (2013.01); *H01L 21/265* (2013.01);
(Continued)

(58) Field of Classification Search
CPC ........... H01L 21/265; H01L 21/26506; H01L 29/0634; H01L 29/0696; H01L 29/66712; H01L 29/7802; H01L 29/7811
See application file for complete search history.

(56) References Cited

U.S. PATENT DOCUMENTS

| 6,066,878 A | 5/2000 | Neilson et al. |
| 6,081,009 A | 6/2000 | Neilson |

(Continued)

FOREIGN PATENT DOCUMENTS

| DE | 10041344 A1 | 3/2001 |
| DE | 10049861 A1 | 4/2002 |

OTHER PUBLICATIONS

Bai, Y. et al., "Junction Termination Technique for Super Junction Devices", The 12th International Symposium on Power Semiconductor Devices and ICs, May 2000, Toulouse, France, pp. 257-261.

(Continued)

*Primary Examiner* — Marvin Payen
*Assistant Examiner* — Victor Barzykin
(74) *Attorney, Agent, or Firm* — Murphy, Bilak & Homiller, PLLC

(57) ABSTRACT

A super junction semiconductor device is formed by forming at least a portion of a drift layer on a doped layer of a first conductivity type, implanting first dopants of a first conductivity type and second dopants of a second conductivity type into the drift layer using one or more implant masks with openings to form stripe-shaped first implant regions of the first conductivity type and stripe-shaped second implant regions of the second conductivity type in alternating order, and performing a heat treatment for controlling a diffusion of dopants from the implant regions to form stripe-shaped first regions of the first conductivity type and stripe-shaped second regions of the second conductivity type.

13 Claims, 14 Drawing Sheets

(51) Int. Cl.
*H01L 21/265* (2006.01)
*H01L 29/66* (2006.01)
*H01L 21/225* (2006.01)
*H01L 21/266* (2006.01)
*H01L 21/324* (2006.01)

(52) U.S. Cl.
CPC ....... *H01L21/266* (2013.01); *H01L 21/26506* (2013.01); *H01L 21/324* (2013.01); *H01L 29/0696* (2013.01); *H01L 29/66712* (2013.01); *H01L 29/7802* (2013.01); *H01L 29/7811* (2013.01)

(56) References Cited

U.S. PATENT DOCUMENTS

| | | | |
|---|---|---|---|
| 6,281,531 B1 * | 8/2001 | Kamashita | H01L 27/14609 257/258 |
| 6,677,643 B2 | 1/2004 | Iwamoto et al. | |
| 6,724,042 B2 | 4/2004 | Onishi et al. | |
| 6,844,592 B2 | 1/2005 | Yamaguchi et al. | |
| 6,903,418 B2 | 6/2005 | Iwamoto et al. | |
| 7,002,205 B2 | 2/2006 | Onishi et al. | |
| 7,042,046 B2 | 5/2006 | Onishi et al. | |
| 7,317,225 B2 | 1/2008 | Saito et al. | |
| 7,335,949 B2 | 2/2008 | Ninomiya et al. | |
| 7,372,100 B2 | 5/2008 | Saito | |
| 7,432,134 B2 | 10/2008 | Ninomiya et al. | |
| 7,592,668 B2 | 9/2009 | Kocon | |
| 7,595,542 B2 | 9/2009 | Park et al. | |
| 7,605,423 B2 | 10/2009 | Saito | |
| 7,649,223 B2 | 1/2010 | Kawashima | |
| 7,964,931 B2 | 6/2011 | Aoki | |
| 8,564,024 B2 | 10/2013 | Yedinak et al. | |
| 8,575,707 B2 | 11/2013 | Tamaki et al. | |
| 2001/0028083 A1 | 10/2001 | Onishi et al. | |
| 2003/0222327 A1 | 12/2003 | Yamaguchi et al. | |
| 2005/0077572 A1 | 4/2005 | Yamauchi et al. | |
| 2007/0001230 A1 | 1/2007 | Lee et al. | |
| 2007/0138543 A1 | 6/2007 | Saito | |
| 2007/0272979 A1 | 11/2007 | Saito et al. | |
| 2008/0001217 A1 | 1/2008 | Kawashima | |
| 2008/0076223 A1 | 3/2008 | Ninomiya et al. | |
| 2008/0135926 A1 | 6/2008 | Ono et al. | |
| 2009/0085146 A1 | 4/2009 | Aoki | |
| 2010/0032791 A1 | 2/2010 | Hozumi et al. | |
| 2010/0140689 A1 | 6/2010 | Yedinak et al. | |
| 2010/0200936 A1 | 8/2010 | Saito et al. | |
| 2011/0204442 A1 | 8/2011 | Guan et al. | |
| 2012/0161274 A1 | 6/2012 | Lee et al. | |
| 2013/0277740 A1 | 10/2013 | Guan et al. | |

OTHER PUBLICATIONS

Fujihira, T., "Theory of Semiconductor Superjunction Devices", Japanese Journal of Applied Physics, vol. 36 (1997), Part 1, No. 10, Oct. 1997, pp. 6254-6262.

Reinelt, N. et al., "Increasing the Breakdown Capability of Superjunction Power MOSFETs at the Edge of the Active Region", 13th European Conference on Power Electronics and Applications, Sep. 2009, Barcelona, Spain, pp. 1-10.

\* cited by examiner

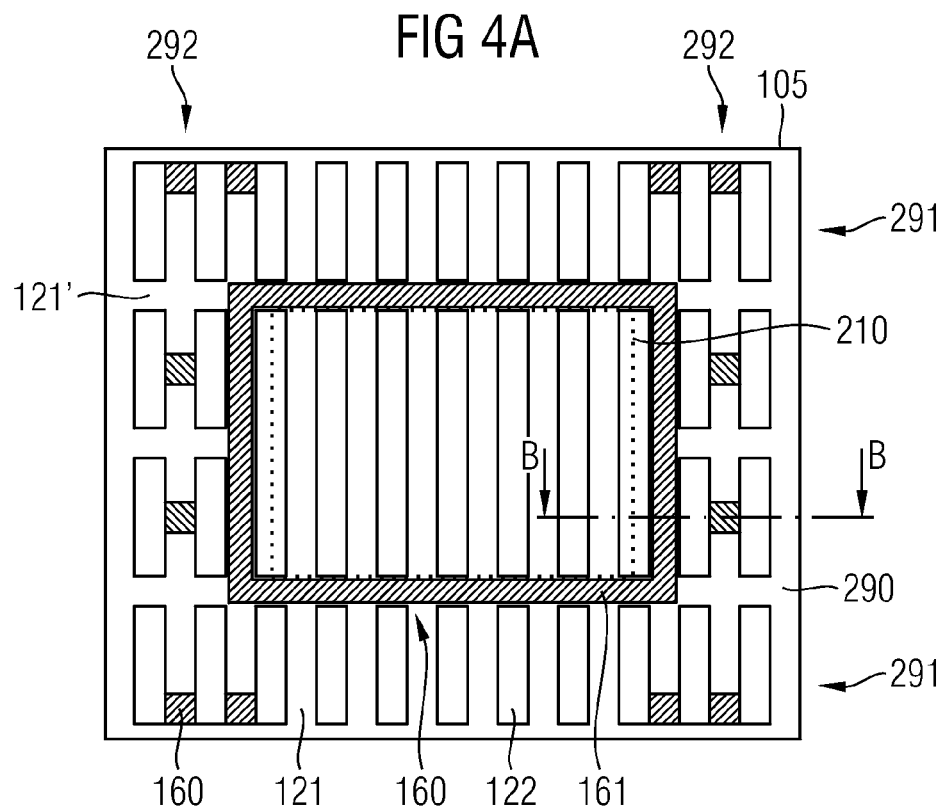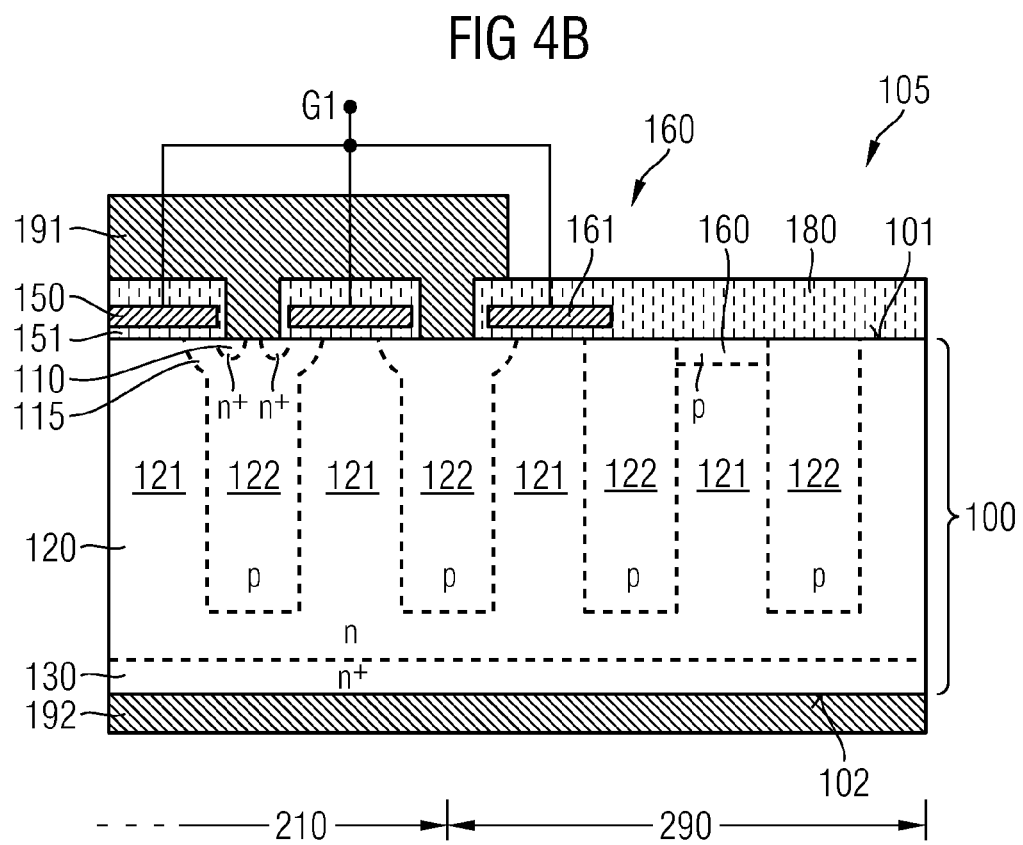

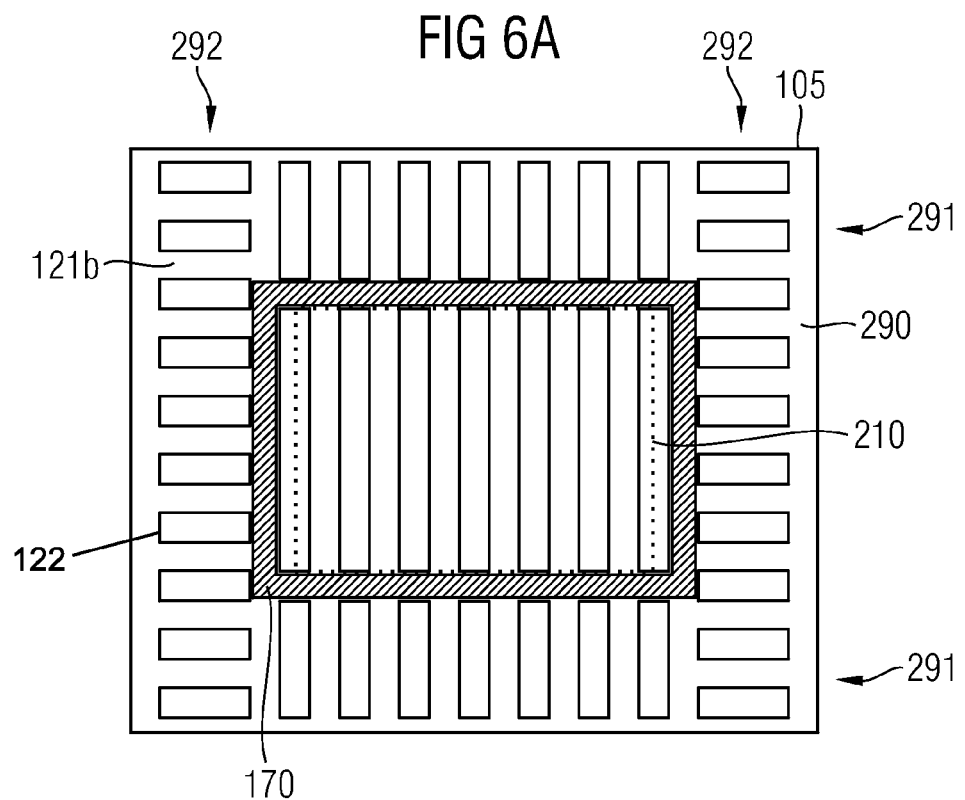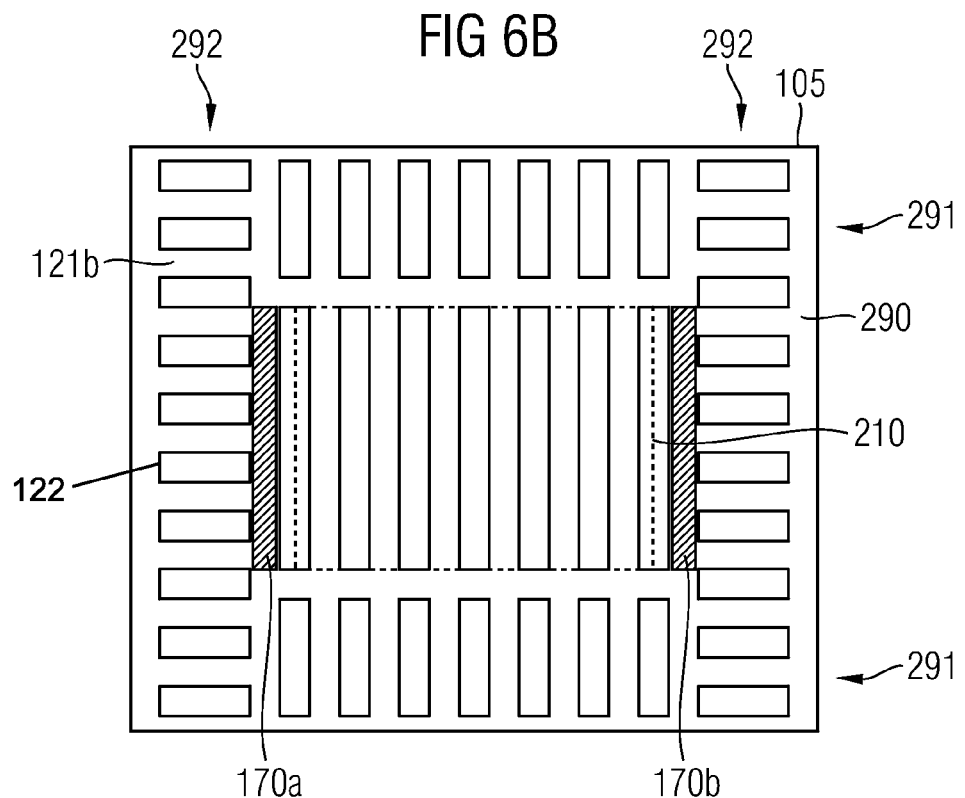

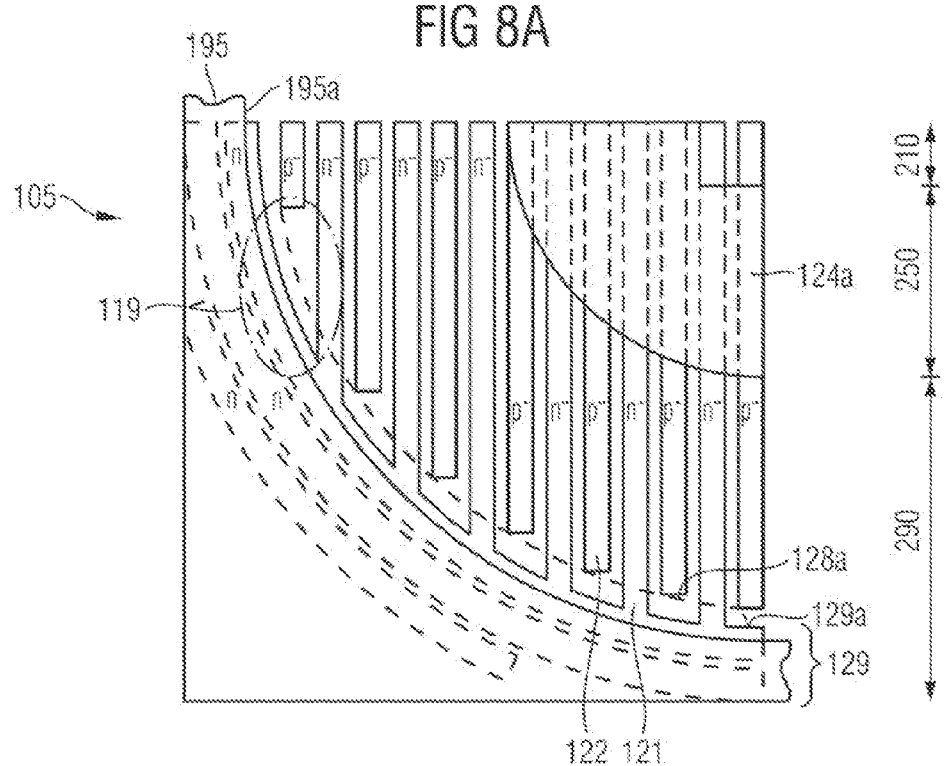
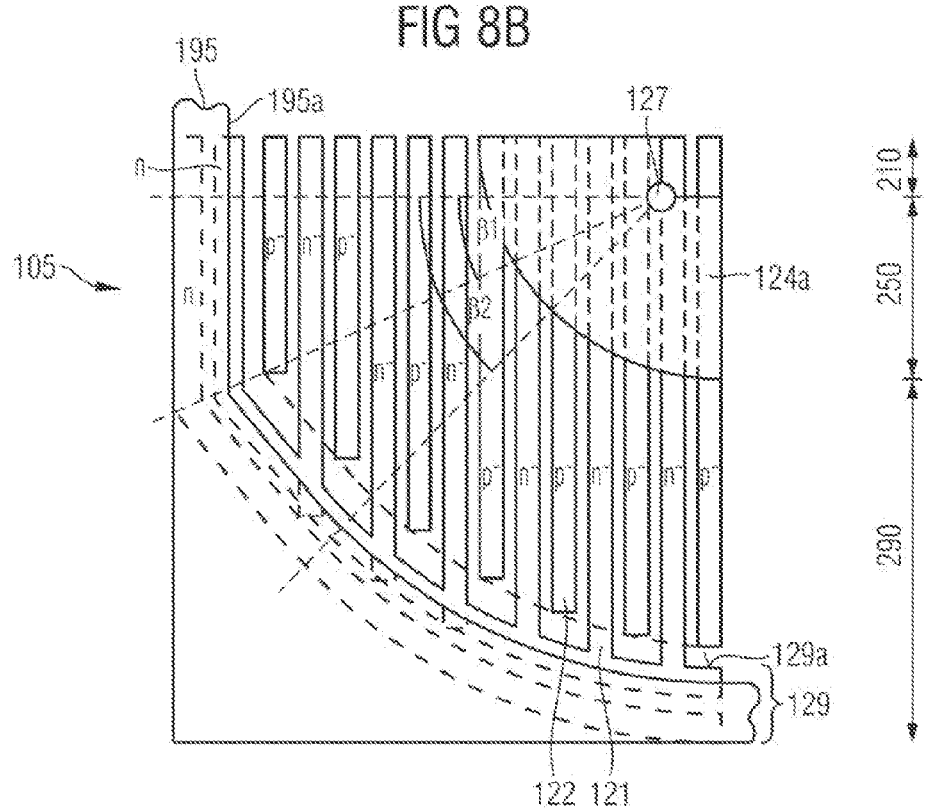

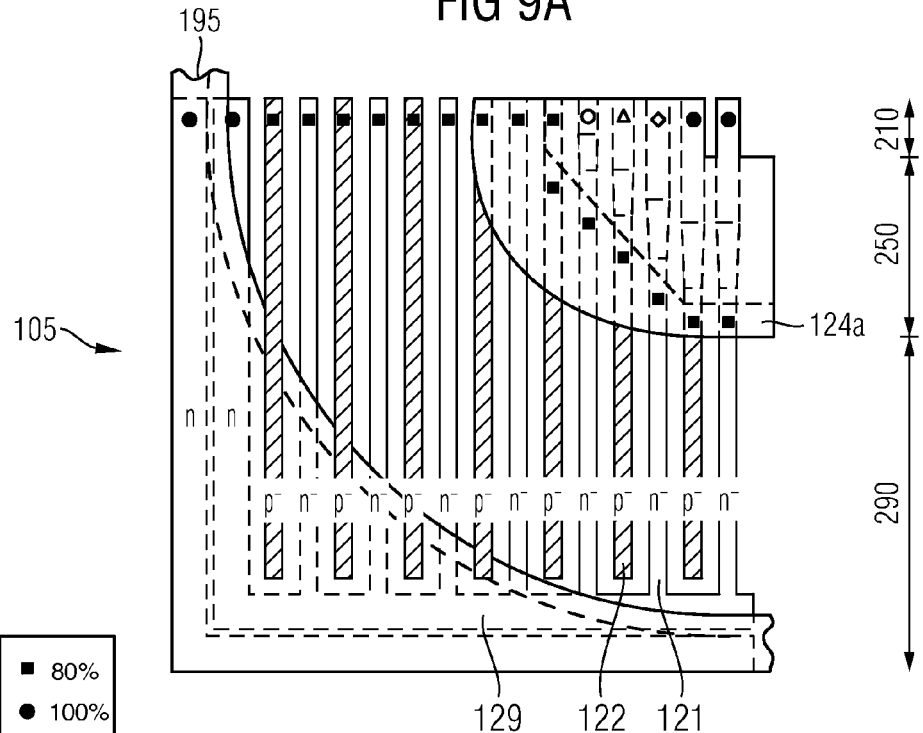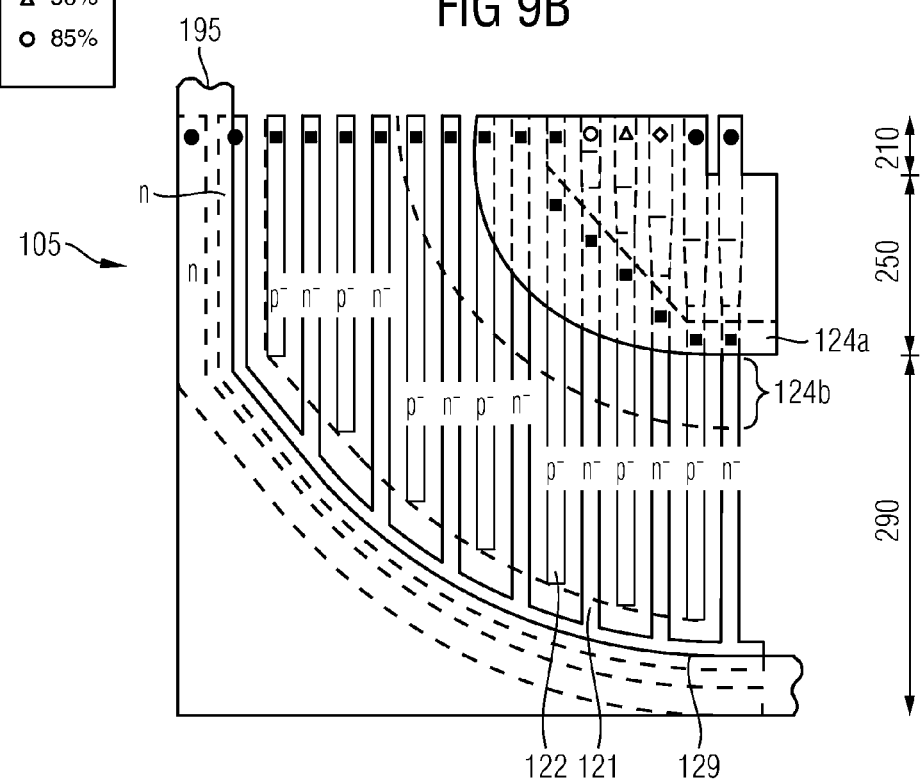

METHOD OF FORMING A SUPER JUNCTION SEMICONDUCTOR DEVICE HAVING STRIPE-SHAPED REGIONS OF THE OPPOSITE CONDUCTIVITY TYPES

BACKGROUND

The drift layer of a super junction semiconductor device typically includes n-doped and p-doped columns. A high impurity concentration in the n-doped columns results in a low on-state resistance of the semiconductor device. On the other hand, when a reverse voltage is applied, depletion zones extend between the n-doped columns and the p-doped columns in a lateral direction such that a high reverse breakdown voltage can be achieved despite the high impurity concentration in the n-doped columns. It is desirable to improve the forward and reverse characteristics of super junction semiconductor devices.

SUMMARY

According to an embodiment, a super junction semiconductor device includes one or more doped zones in a cell area. A drift layer is provided between a doped layer of a first conductivity type and the one or more doped zones. The drift layer includes first regions of the first conductivity type and second regions of a second conductivity type, which is the opposite of the first conductivity type. In an edge area that surrounds the cell area, the first regions include first portions separating the second regions in a first direction and second portions separating the second regions in a second direction orthogonal to the first direction. The first and second portions are arranged such that a longest second region in the edge area is at most half as long as a dimension of the edge area parallel to the longest second region.

According to another embodiment, a super junction semiconductor device includes one or more doped zones formed in a cell area. A drift layer is provided between the one or more doped zones and a doped layer of a first conductivity type. The drift layer includes first regions of the first conductivity type and second regions of a second conductivity type opposite to the first conductivity type. In an edge area surrounding the cell area portions of the first regions separate second regions of the edge area from second regions in the cell area. A coupling element is provided between at least one of the second regions of the cell area and one of the second regions of the edge area. The coupling element is adapted to electrically couple the at least one of the second portions of the cell area and the one of the second portions of the edge area at least in a first state.

According to another embodiment, a super junction semiconductor device includes one or more doped zones formed in a cell area. A drift layer is provided between the one or more doped zones and a doped layer of a first conductivity type. The drift layer includes alternatingly arranged stripe-shaped first regions of the first conductivity type and stripe-shaped second regions of a second conductivity type opposite to the first conductivity type. In an edge area surrounding the cell area the first and second regions are formed at a first distance to the first surface.

According to an embodiment related to a method of manufacturing a super junction semiconductor device at least a portion of a drift layer is formed on a doped layer of a first conductivity type. First dopants of a first conductivity type and second dopants of a second conductivity type are implanted into the drift layer using one or more implant masks with openings, wherein stripe-shaped first implant regions of the first conductivity type and stripe-shaped second implant regions of the second conductivity type are formed in alternating order. A heat treatment is performed for controlling a diffusion of the implanted first and second dopants from the implant regions to form stripe-shaped first regions of the first conductivity type and stripe-shaped second regions of the second conductivity type.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4A is a schematic plan view of a semiconductor die of a super junction semiconductor device in accordance with an embodiment providing a controllable coupling element of the enhancement type and non-controllable coupling elements.

FIG. 4B is a schematic cross-sectional view of the super junction semiconductor device of FIG. 4A along line B-B.

FIG. 6A is a schematic plan view of a semiconductor die of a super junction semiconductor device in accordance with an embodiment related to a circumferential controllable coupling element and orthogonal first and second regions in the edge area.

FIG. 6B is a schematic plan view of a semiconductor die of a super junction semiconductor device in accordance with an embodiment related to a two-part controllable coupling element and orthogonal first and second regions in the edge area.

FIG. 8A is a schematic plan view of a corner section of a semiconductor die of a super junction semiconductor device in accordance with an embodiment providing a curved circumferential implant zone.

FIG. 8B is a schematic plan view of a corner section of a semiconductor die of a super junction semiconductor device in accordance with an embodiment providing a circumferential implant zone with straight and curved sections.

FIG. 9A is a schematic plan view of a corner section of a semiconductor die of a super junction semiconductor device in accordance with an embodiment related to attenuated first and second regions in the edge area.

FIG. 9B is a schematic plan view of a corner section of a semiconductor die of a super junction semiconductor device in accordance with an embodiment with attenuated first and second regions in the edge area and a circumferential implant zone having straight and curved portions.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a low-ohmic connection between the elements electrically connected together, for example a direct contact between the concerned elements or a connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1A:
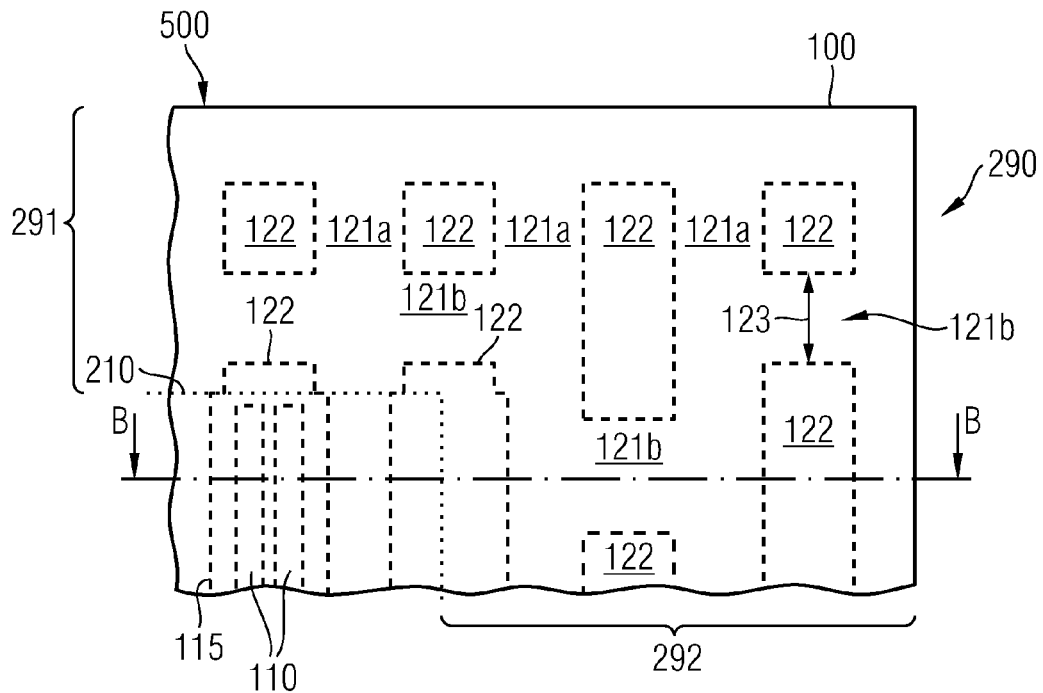
FIG. 1A is a schematic cross-sectional view of a super junction semiconductor device in a plane parallel to a surface of a semiconductor die in accordance with an embodiment related to interconnected first regions of a first conductivity type in an edge area.
Figure 1B:
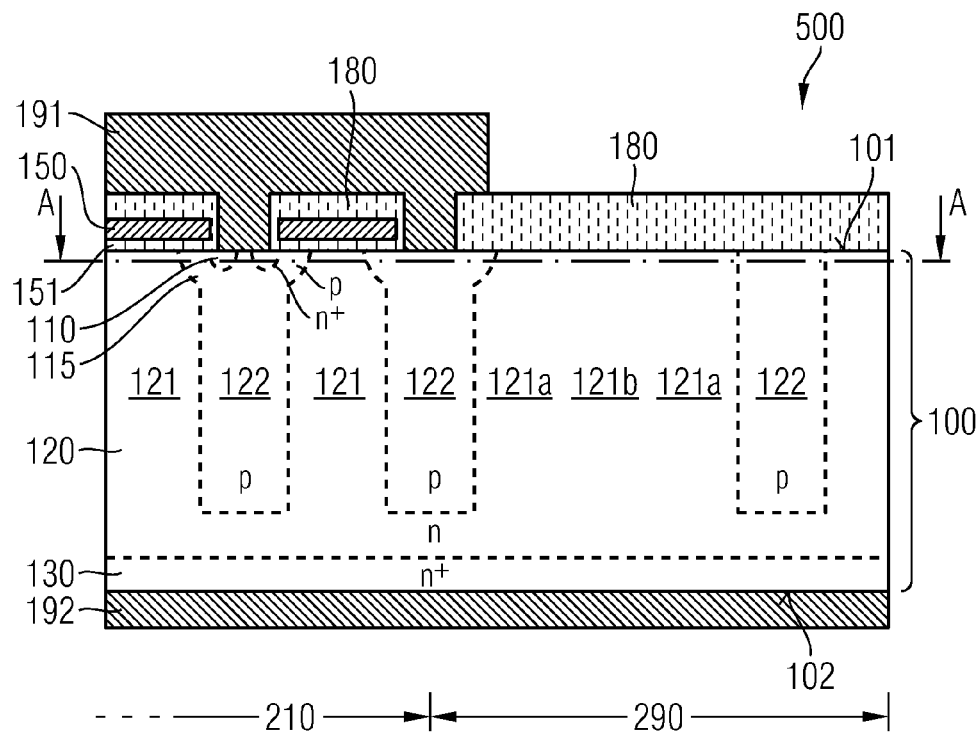
FIG. 1B is a schematic cross-sectional view of the super junction semiconductor device of FIG. 1A along line B-B.

FIGS. 1A and 1B refer to a super junction semiconductor device 500, wherein FIG. 1A is a cross-sectional view in a plane parallel to a first surface 101 of a semiconductor body 100 indicated by line A-A in FIG. 1B. FIG. 1B is a cross-sectional view perpendicular to the cross-sectional plane of FIG. 1A along line B-B in FIG. 1A.

The semiconductor body 100 of the super junction semiconductor device 500 is provided from a single-crystalline semiconductor material, for example silicon Si, silicon carbide SiC, germanium Ge, a silicon-germanium crystal SiGe or gallium arsenide GaAs. The semiconductor body 100 has a first surface 101 and a second surface 102 which is parallel to the first surface 101. A distance between the first and the second surface 101, 102 is up to several hundred micrometers or more and is closely related to the reverse breakdown voltage, which is the minimum applied voltage in reverse direction that causes the semiconductor device 500 to break down. The semiconductor body 100 may have a rectangular shape with an edge length in the range of several millimeters. The normal to the first and second surfaces 101, 102 defines a vertical direction and directions orthogonal to the normal are lateral directions.

The semiconductor body 100 includes a doped layer 130 of a first conductivity type. A net dopant concentration in the doped layer 130 is comparatively high and may be at least $10^{17}$ cm$^{-3}$, by way of example. The doped layer 130 may extend along a complete cross-sectional plane of the semiconductor body 100 parallel to the second surface 102. According to an embodiment, the doped layer 130 directly adjoins the second surface 102. According to other embodiments, a further layer may be provided between the doped layer 130 and the second surface 102. For example, a further doped layer of a second conductivity type, which is the opposite of the first conductivity type, may be arranged between the doped layer 130 and the second surface 102.

An interface between the doped layer 130 and a drift layer 120 is parallel to the first and second surfaces 101, 102. The drift layer 120 is formed between the first surface 101 and the doped layer 130. The drift layer 120 includes first regions 121 of the first conductivity type and second regions 122 of the second conductivity type. The second regions 122 may be in direct contact with the doped layer 130. According to other embodiments, the second regions 122 are formed distant to the doped layer 130 such that the drift layer 120 includes a contiguous portion of the first conductivity type extending between buried edges of the first and second regions 121, 122 on the one hand and the doped layer 130 on the other hand.

The semiconductor body 100 includes a cell area 210 and an edge area 290 surrounding the cell area 210 in the lateral directions. The edge area 290 extends along the edges of the semiconductor body 100. The edge area 290 may directly adjoin the cell area 210. According to other embodiments, a transition area may separate the edge and the cell area 290, 210, wherein in the transition area some features characterizing the cell area 210 or the edge area 290 may be absent.

The semiconductor body 100 further includes one or more doped zones 110 formed in the cell area 210. The one or more doped zones 110 have the same conductivity type. In an on-state of the semiconductor device 500, an on-state or forward current flows between the one or more doped zones 110 and the doped layer 130 through the drift layer 120.

According to an embodiment, the plurality of doped zones 110 of the first conductivity type are provided, wherein each of the doped zones 110 directly adjoins to a base zone 115 of the second conductivity type. Each base zone 115 may directly adjoin to at least one of the first and one of the second regions 121, 122 in the cell area 210 to form a super junction IGFET (insulated gate field effect transistor) or a super junction IGBT (insulated gate bipolar transistor) device. According to another embodiment one single doped zone 110 of the second conductivity type directly adjoins the first and second portions 121, 122 in the cell area 210 to form a super junction diode.

At least the doped zones 110 are exclusively formed within the cell area 210 and are absent in the edge area 290. The base zones 115 are provided in the cell area 210 and may or may not be absent in the edge area 290.

For IGFETs and IGBTs, gate electrode structures 150 may be provided to control a minority charge carrier distribution in the base zone 115 between the doped zones 110 and the corresponding first regions 121. A gate dielectric 151 may be formed between the gate electrode structures 150 and the corresponding base zone 115. The gate electrode structures 150 may be arranged above the first surface 101. According to other embodiments the gate electrode structures 150 may be provided in trenches extending from the first surface 101 into the semiconductor body 100.

A first electrode 191 may be electrically connected to the doped zones 110 and the base zones 115 through openings in a dielectric layer 180 between the gate electrode structures 150, wherein highly doped contact zones may be formed within the base zones 115 in direct contact with the first electrode 191. The dielectric layer 180 between the first electrode 191 and the semiconductor body 100 may electrically insulate the first electrode 191 from the first regions 121 in the edge area 290 and the gate electrode structures 150.

A second electrode 192 may directly adjoin the doped layer 130. According to embodiments related to IGBTs, a further doped layer of the second conductivity type may be formed between the doped layer 130 and the second electrode 192. According to the illustrated embodiment, the first conductivity type is n-type, the second conductivity type is p-type, the first electrode 191 is a source electrode, the doped zones 110 are source zones, and the second electrode 192 is a drain electrode. According to other embodiments, the first conductivity type is p-type.

According to an embodiment related to connected regions of the first conductivity type in the edge area 290, the first regions 291 in the edge area 290 include first portions 121a separating the second regions 122 in a first direction and second portions 121b separating the second regions 122 in a second direction orthogonal to the first direction. Widths of at least some of the first portions 121a and widths of at least some of the second portions 121b are equal to or greater than a mean width of the first regions 121 in the cell area 210. The first portions 121a may have a uniform first width and the second portions 121b may have a uniform second width 123, wherein the width is the distance between the closest neighboring second regions 122 on opposite sides of the respective first or second portion 121a, 121b.

The first and second portions 121a, 121b are arranged such that a longest second region 122 in the edge area 290 is at most half as long as a dimension of the edge area 290 parallel to the longest second region 122. According to an embodiment, the longest second region 122 in the edge area 290 may be at most half as long as any of the second regions 122 in the cell area 210. The first and second widths may be equal.

According to another embodiment, in first edge areas 291 situated on the sides of the cell area 210 into which the first and second regions 121, 122 of the cell area 210 project, a specific line resistance of the first portions 121a along the second direction is at least equal to a specific line resistance of the second portions 121b along the first direction, wherein different widths may compensate for different dopant concentrations in the first and second portions 121a, 121b. In second edge areas 292 extending along the two sides of the cell area 210 parallel to the projecting direction of the first and second regions 121, 122, a specific line resistance of the second portions 121b along the first direction is at least equal to a specific line resistance of the first portions 121a along the second direction, wherein different widths may compensate for different dopant concentrations in the first and second portions 121a, 121b.

The arrangement of first and second portions 121a, 121b in the edge area 290 provide gaps between the second regions 122 resulting in a low-ohmic connection of at least a part, a majority, or all first regions 121a, 121b of the edge area 290 with first regions 121 in the cell area 210 such that even at least some of the first regions 121a, 121b in the edge area 290 can carry a portion of the on-state current and contribute to a further reduction of the on-state resistance of the device.

The first and second regions 121, 122 may be stripe-shaped, wherein the first regions 121 in the cell area 210 may have a uniform width. According to an embodiment, all first regions 121 may have a uniform width and the second width 123 of the second portions 121b is equal to or greater than the width of the first regions 121 in the cell area 210.

According to a further embodiment, the first and second portions 121a, 121b connect at least 50%, for example 75% or more, 90% or more, or all of the area assigned to the first regions 121 in the edge area 290 with one or more of the first regions 121 in the cell area 210. The first and second portions 121a, 121b may connect areas on four sides of the cell area 210 with one or more first regions 121 of the cell area 210. For each side of the cell area 210, in the edge area 290 along at least one or each line parallel to one of the edges of the cell area 210 and intersecting a second region 122 a ratio of a total length of the first or second portions 121a, 121b to a total length of the second regions 122 is greater 20%.

In accordance with the embodiments, at least 50%, for example 75% or more, 90% or more, or all of the second regions 122 of the edge area 290 are disconnected from the second regions 122 in the cell area 210. In the edge area 290, along lines parallel to the first and second directions more than two first or second portions 121a, 121b are provided to minimize the ohmic resistance in the connection of a maximum number of first and second portions 121a, 121b.

Figure 2A:
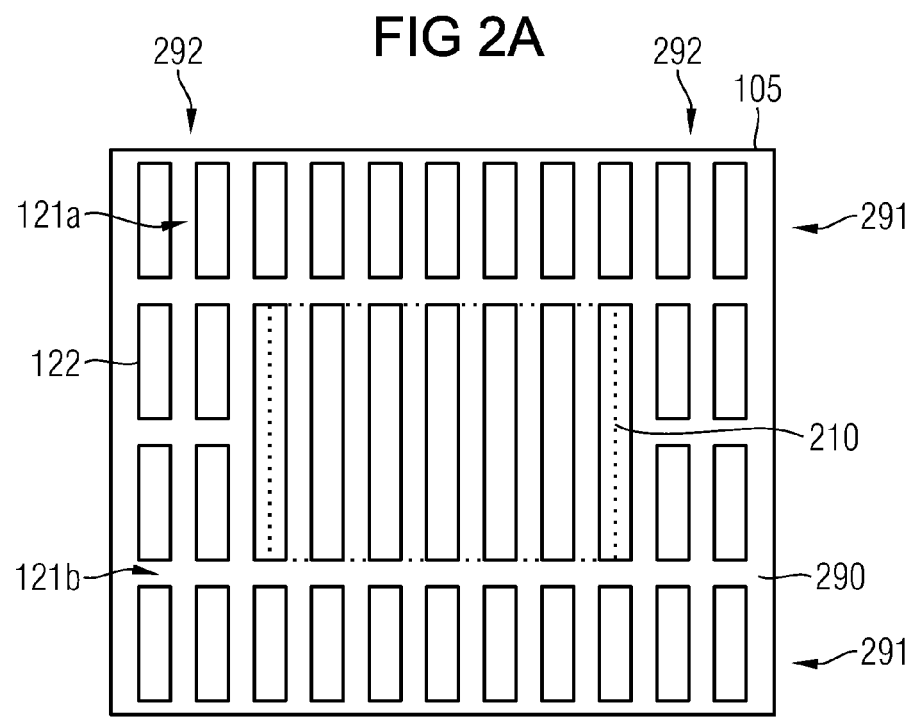
FIG. 2A is a schematic plan view of a semiconductor die of a super junction semiconductor device for illustrating the arrangement of first and second regions in accordance with an embodiment related to first regions connected along an edge of a cell area.

FIG. 2A refers to an embodiment which is based on a regular arrangement of stripe-shaped first and second regions 121, 122 in the cell area 210. The first and second regions 121, 122 are arranged alternately and parallel to each other. In the edge area 290, second portions 121b of first regions 121 separate neighboring second portions 122 along a second direction along which the first and second regions 121, 122 in the cell area 210 extend. The second portions 121b may be arranged along separation lines running along a first direction orthogonal to the stripe-shaped first and second regions 121, 122 in the cell area 210. Two of the separation lines are provided on opposing sides of the cell area 210 and adjoin directly to the cell area 210. According to the illustrated embodiment, the first and second directions are lateral directions.

In first edge areas 291 situated on the sides of the cell area 210 into which the first and second regions 121, 122 of the cell area 210 project, the two separation lines directly adjoining the cell area 210 separate the second regions 122 of the first edge areas 291 completely from the second regions 122 in the cell area 210 such that all second regions 122 outside the cell area 210 may float. In second edge areas 292 extending along the two sides of the cell area 210 parallel to the projecting direction of the first and second regions 121, 122, further separation lines between the edge of the semiconductor die 105 and the cell area 210 provide low-resistance paths between first regions 121 oriented to the respective edge of the semiconductor die 105 and the first regions 121 in the cell area 210.

Figure 2B:
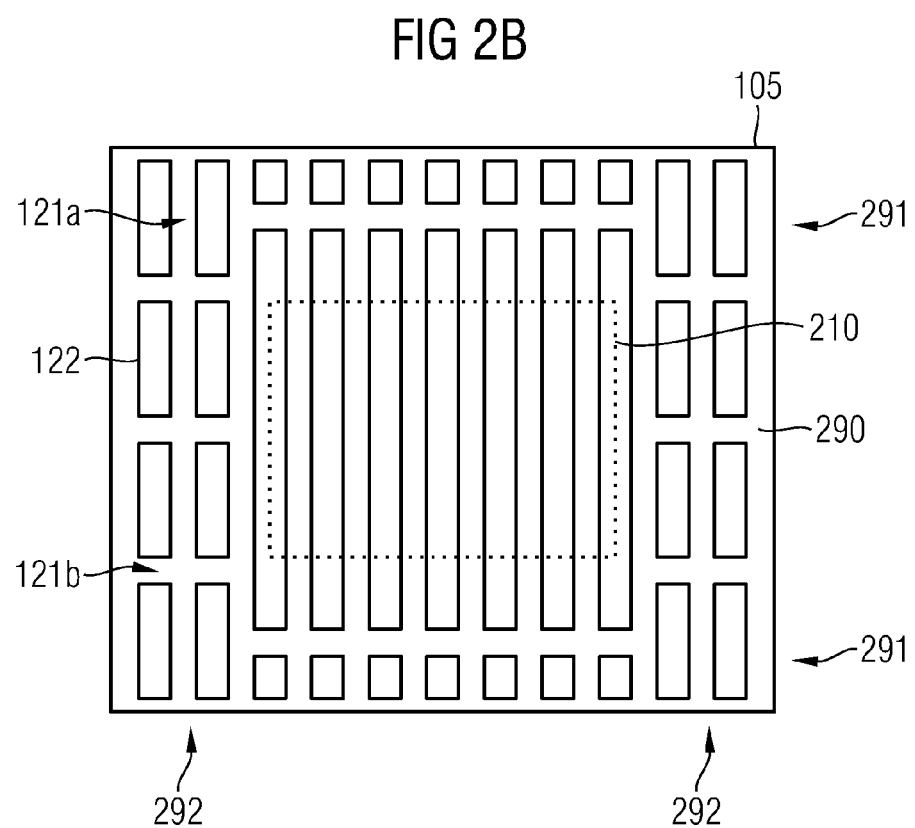
FIG. 2B is a schematic plan view of a semiconductor die of a super junction semiconductor device for illustrating the arrangement of first and second regions in accordance with an embodiment related to first and second regions protruding from a cell area into an edge area.

The embodiment illustrated in FIG. 2B differs from the embodiment in FIG. 2A in that the first and second regions 121, 122 of the cell area 210 project into the first edge areas 291. While the embodiment of FIG. 2A may provide a lower-ohmic connection between the first regions 121 of the edge and cell areas 290, 210, the embodiment of FIG. 2B may provide lateral depletion zones even in portions of the first edge regions 291 outside the cell area 210 and may provide increased reverse breakdown stability.

Figure 2C:
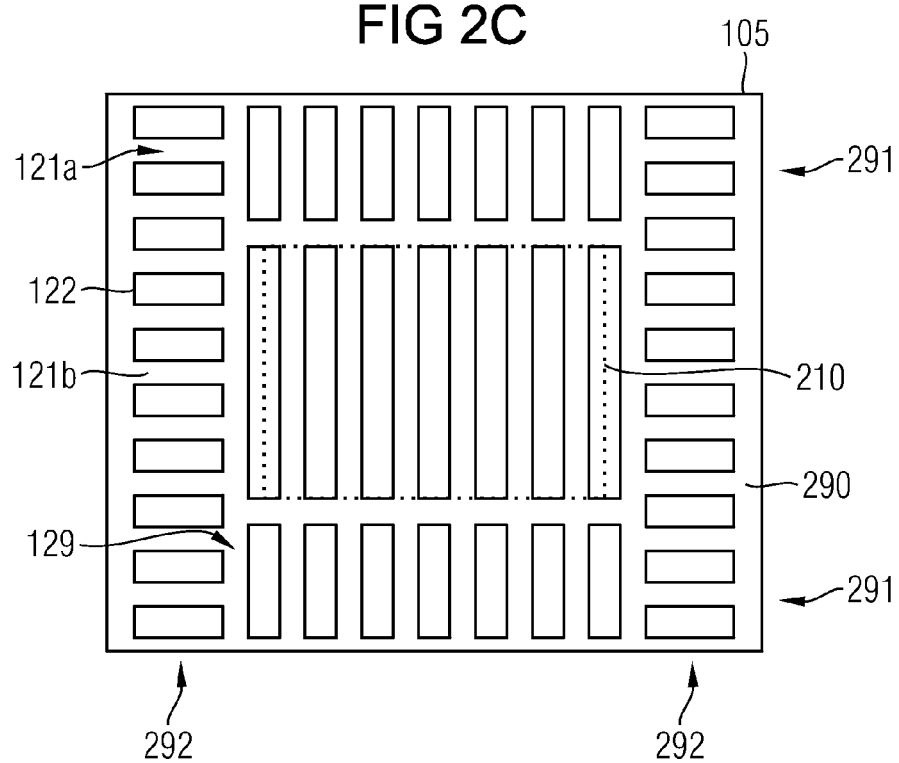
FIG. 2C is a schematic plan view of a semiconductor die of a super junction semiconductor device for illustrating the arrangement of first and second regions in accordance with an embodiment related to orthogonal orientated first and second regions in an edge area.

The embodiment of FIG. 2C differs from the embodiment illustrated in FIG. 2A in that in the second edge areas 292 the first and second regions 121, 122 are oriented perpendicular to the first and second regions 121, 122 of the cell area 210. In the second edge areas 292, a lower-ohmic connection may be provided between the first regions 121 in the cell area 210 and each second portion 121b of the edge area 290.

Figure 2D:
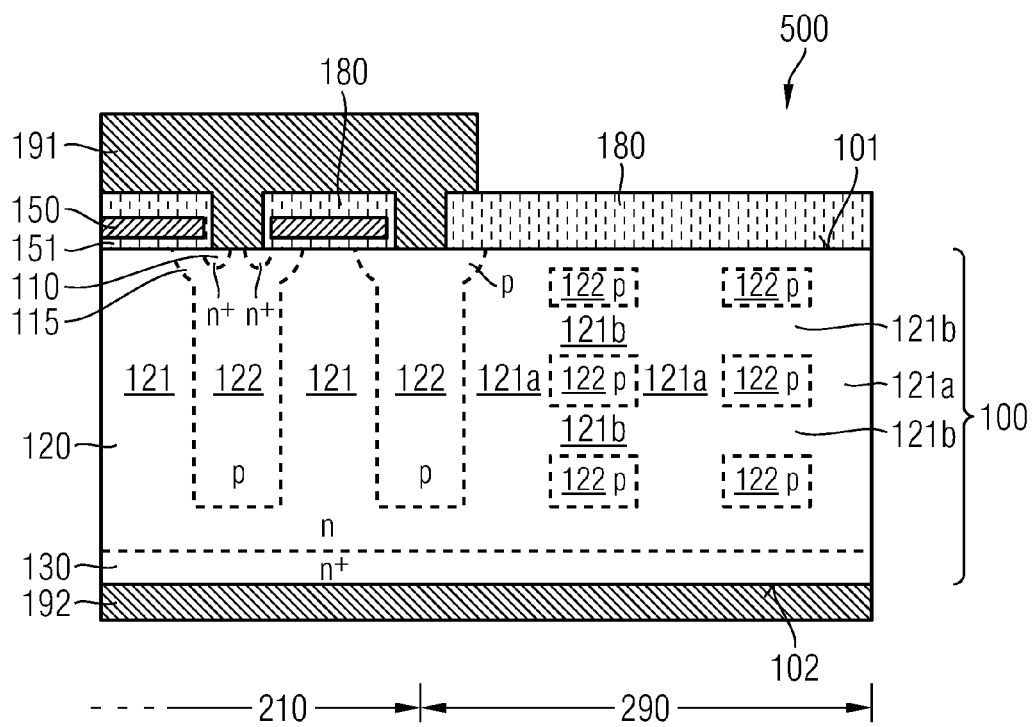
FIG. 2D is a schematic cross-sectional view of a section of a super junction semiconductor device in accordance with an embodiment related to vertically segmented second regions in the edge area.

FIG. 2D refers to an embodiment where the second direction is the vertical direction. The second portions 121b segment the second regions 122 in the vertical direction with respect to the first and second surfaces 101, 102 of the semiconductor body 100.

For embodiments with the gate electrode structures 150 provided outside the contour of the semiconductor body 100, the first regions 121 in substance extend between the first surface 101 and a buried edge of the second regions 122 or, in the case of embodiments related to gate electrode structures 150 provided in trenches extending from the first surface 101 into the semiconductor body 100, the first regions 121 may extend from a lower edge of the base zones 115 to the buried edges of the second regions 122.

According to the above described embodiments, the second regions 122 in the edge area 290 are without connection to a structure supplying a signal or a fixed potential such that the second regions 122 in the edge area 290 float and do not contribute to the output capacity $C_{oss}$ of the device such that during operation switching losses are reduced.

According to the following embodiments, coupling elements 160 may be provided between at least one of the second regions 122 of the cell area 210 and one, some, a majority, or all of the second regions 122 of the edge area 290. Each coupling element 160 electrically connects the concerned second regions 122 of the cell and edge areas 210, 290 at least in a first state of the coupling element 160, wherein a state of the coupling elements 160 may correspond to a state of the semiconductor device.

Figure 3A:
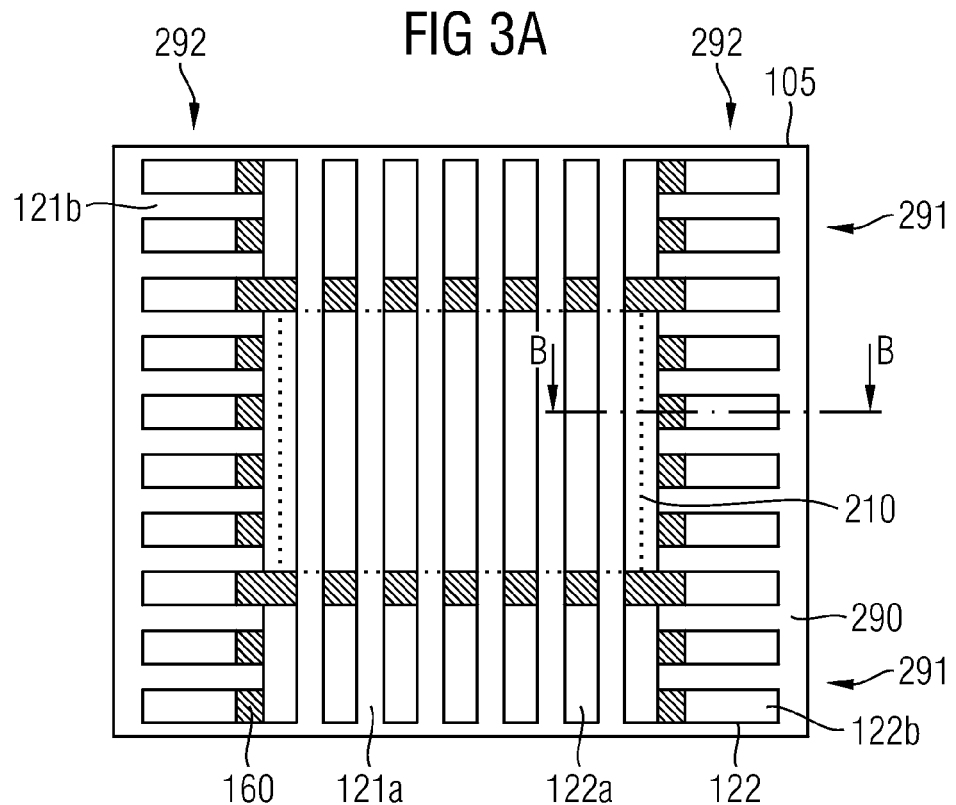
FIG. 3A is a schematic plan view of a semiconductor die of a super junction semiconductor device in accordance with an embodiment related to coupling elements for connecting second regions of the edge and the cell area.
Figure 3B:
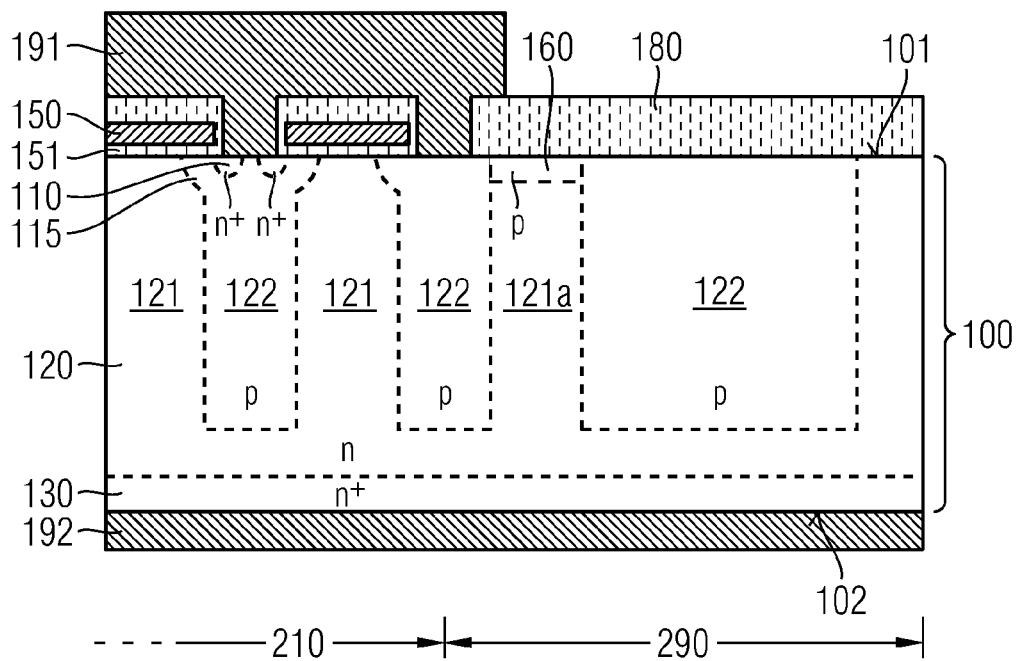
FIG. 3B is a schematic cross-sectional view of a section of the super junction semiconductor device of FIG. 3A along line B-B.

FIGS. 3A and 3B refer to an embodiment with stripe-shape first and second regions 121, 122 alternately arranged parallel to each other and forming a regular pattern. In first edge areas 291 arranged in the projecting directions of the first and second regions 121, 122 of the cell area 210, first portions 122a of second regions 122 are arranged in the projection of the second regions 122 of the cell area 210. In second edge areas 292 extending on opposing sides of the cell area 210 parallel to the first and second regions 121, 122 of the cell area 210, second portions 122b of the second regions 122 extend along a direction orthogonal to the projecting direction. First portions 121a of the first regions 121 in the edge area 290 are formed as extensions of the first regions 121 of the cell area 210 and separate neighboring first portions 122a of the second regions 122 in the first edge areas 291 from each other. In the second edge areas 292 second portions 121b of the first regions 121 separate neighboring second portions 122b of the second regions 122. In the first edge areas 291 the first portions 121a of the first regions 121 separate the first portions 122a of the second regions 122 from the second regions 122 in the cell area 210.

Coupling elements 160 are provided between first and second portions 122a, 122b of the second regions 122 of the edge area 290 and the second regions 122 in the cell area 210. The coupling elements 160 may be regions of the second conductivity type having a low impurity concentration, for example lower than $10^{16}$ cm$^{-3}$. According to an embodiment, the regions of low impurity concentration are formed close or directly adjoining to the first surface 101. An extension of the not-controllable coupling elements 160 in the vertical direction is significantly smaller, for example less than 20%, than that of the first and second regions 121, 122. Sections of the first and second portions 121a, 121b of the first regions 121 in the edge area 290 extend from a buried edge of the regions of low impurity concentration to the buried edge of the second regions 122. Through the coupling elements 160 the potential of the first and second portions 122a, 122b of the second regions 122 in the edge area 290 is tied to the potential of the second regions 122 of the cell area 210, which may be the potential of the first electrode 191.

Since the coupling elements 160 connect first and second portions 122a, 122b of the second regions 122 in the edge area 290 with the second regions 122 of the cell area 210, no or only few charge accumulates in the second portions 122 of the edge area 290. As a consequence, when the device switches from the off-state or reverse state to the on-state, the edge area 290 reaches the maximum conductivity at a significantly reduced delay. As a further consequence, the device consumes less power.

FIGS. 4A and 4B refer to an embodiment with a controllable coupling element 160 arranged to electrically connect one, some or all of the second portions 122 of the edge area 290 with one, some or all of the second portions 122 in the cell area 210 in a first state and to electrically disconnect them in a second state. The controllable coupling element 160 may be a field effect transistor with a coupling gate structure 161 arranged between one or more second regions 122 of the cell area 210, which may be connected with the first electrode 191, and one, some or all of those second regions 122 of the edge area 290 that are neighboring to the cell area 210 without further second regions 122 arranged in-between. The coupling gate structure 161 is arranged to form a channel of charge carriers of the second conductivity type in a first region 121 separating the concerned second regions 122 of the cell and edge areas 210, 290.

According to the illustrated embodiment, the coupling gate structure 161 is arranged at a distance to the first surface 101 outside the contour of the semiconductor body 100. According to another embodiment, the coupling gate structure 161 may be provided in a trench extending from the first surface 101 into the semiconductor body 100.

FIG. 4A shows a circumferential controllable coupling element 161 with a circumferential coupling gate structure 161 extending along the edges of the cell area 210. Further, not-controllable coupling elements 160 may be provided between such second regions 122 in the edge area 290 which potential is controllable through the controllable coupling element 160 and such second regions 122 of the edge area 290, which are not in direct neighborhood to the controllable coupling element 160. The further not-controllable coupling elements 160 may be arranged symmetrically with regard to the cell area 210 in a way to minimize distances between the farthest first regions 121 in the edge area 290 and the cell area 210. The controllable coupling element 160 may be autonomously operated or controlled via further elements.

According to FIG. 4B the coupling gate structure 161 is autonomously controlled and electrically coupled to the gate electrode structures 150 in the cell area 210. According to another embodiment, the coupling gate structure 161 is electrically coupled to the first electrode 191. When the speed of the switching operation is low, only low displacement currents flow, no channel of the second conductivity type is formed in the first region 121 below the coupling gate structure 161, and the controllable coupling element 160 remains in an off-state. When the switching operation of the device is sufficiently fast, a high current of charge carriers of the second conductivity type flows between the edge area 290 and the first electrode 191. The area below the coupling gate structure 161 may reach a potential at which a channel of charge carriers of the second conductivity type is formed through the first region 121 below the gate coupling structure 161 such that a potential of the second regions 122 in the edge area 290 is tied to the potential of the second regions 122 in the cell area 210, which may be that of the first electrode 191. According to an embodiment, the second conductivity type is the p-type and a p-type channel is dynamically formed in the semiconductor body 100 in a region close to the coupling gate structure 170.

Figure 5A:
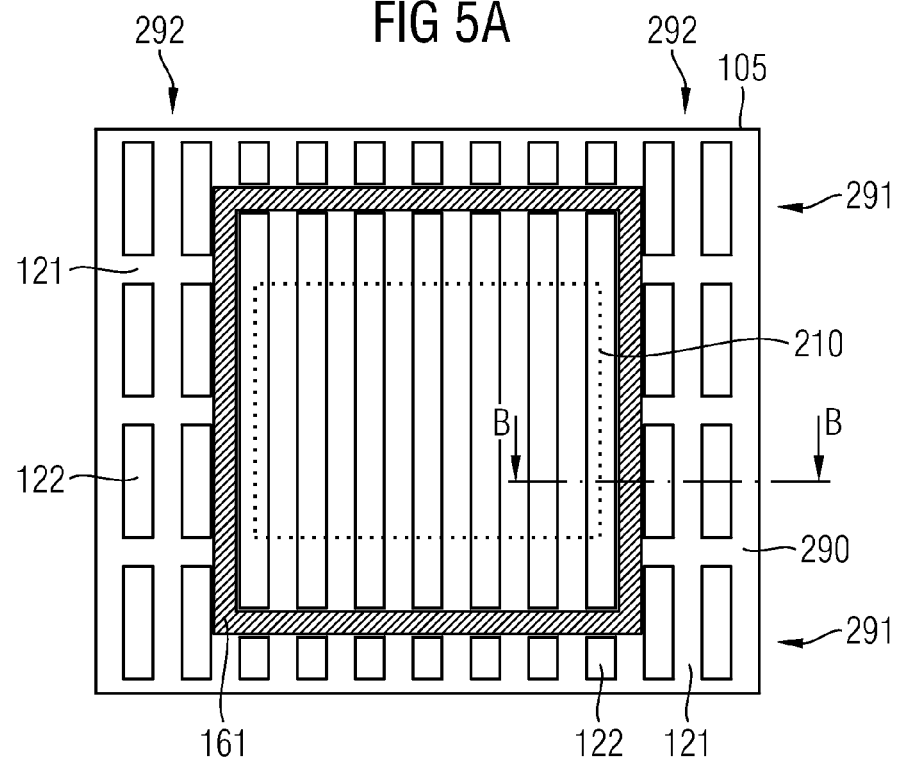
FIG. 5A is a schematic plan view on a semiconductor die of a super junction semiconductor device in accordance with an embodiment related to a controllable coupling element of the depletion type and first and second regions protruding from the cell area into the edge area.
Figure 5B:
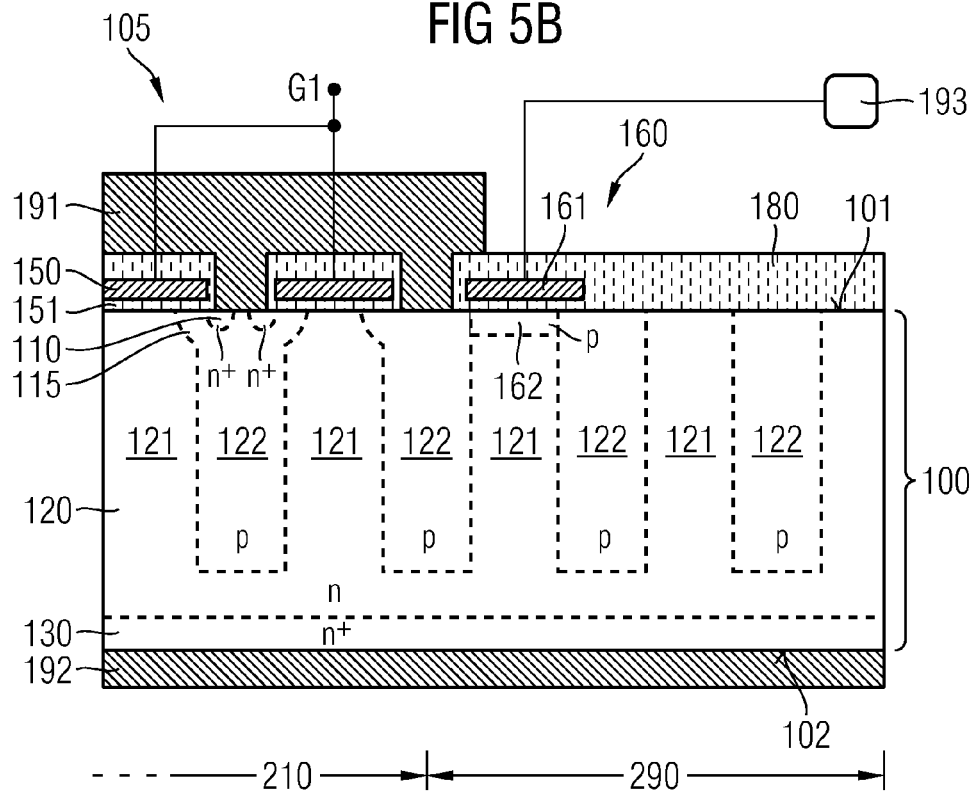
FIG. 5B is a schematic cross-sectional view of the super junction semiconductor device of FIG. 5A along line B-B.

FIGS. 5A and 5B refer to an embodiment with the coupling gate structure 161 controlled through further elements and electrically coupled to a terminal 193 of the semiconductor die 105. According to a similar embodiment, the coupling gate structure 161 is electrically coupled to an output of a driver circuit integrated on the same semiconductor die 105. Control of the potential of the coupling gate structure 161 may correspond to that described with reference to FIGS. 4A and 4B. According to the illustrated embodiment, the coupling element 160 is an enhancement FET (field effect transistor).

When the potential of the coupling gate structure 161 is not tied to the first electrode 191 or the gate electrode structure 150 of the cell area 210, the enhancement FET requires a negative potential at the coupling gate structure 161 for achieving an on-state in which the second regions 122 of the edge area 290 are electrically connected to the second regions 122 in the cell area 210. For an off-state, the enhancement FET requires a reduced potential at the coupling gate structure 161, for example the potential at the first electrode 191.

According to the illustrated embodiment, the coupling element 160 includes a channel zone 162 of the second conductivity type. The channel zone 162 directly adjoins the first surface 101 between the concerned second regions 122 of the edge area 290 and the cell area 210. The controllable coupling element 160 forms a depletion FET. In the on-state of the depletion FET the coupling gate structure 161 may be supplied with the potential of the first electrode 191 to electrically couple the concerned second regions 122 of the edge area 290 and the cell area 210. For switching the coupling element 160 into the off-state, a positive potential is applied to the coupling gate structure 161. No negative driver output voltage is required. The design of a driver circuit for controlling the controllable coupling element 160 is less complicated and the driver circuit requires less resources.

Further according to the embodiment of FIG. 5A the controllable circumferential coupling element 160 completely encloses the cell area 210, wherein a distance is provided between the controllable coupling element 160 and the cell area 210 in the first edge areas 291.

According to the embodiment of FIG. 6A the second portions 122 in the second edge areas 292 run orthogonal to the second regions 122 in the first edge regions 291. A greater area assigned to the second portions 122 can be controllably electrically coupled to the second regions 122 of the cell area 210 directly, i.e. through the controllable connecting element 160 alone.

FIG. 6B differs from the layout of FIG. 6A in that the controllable connecting element 160 is provided only along two opposing sides of the cell area 210 oriented to the second edge areas 292.

Each of the embodiments of FIG. 1A to 1B and 2A to 2D may be provided with a coupling element 160. More generally, embodiments referring to a coupling element provide a super junction semiconductor device that includes one or more doped zones formed in a cell area. A drift layer is provided between the one or more doped zones and a doped layer of a first conductivity type. The drift layer includes first regions of the first conductivity type and second regions of a second conductivity type opposite to the first conductivity type. In an edge area surrounding the cell area portions of the first regions separate second regions of the edge area from second regions in the cell area. A coupling element is provided between at least one of the second regions of the cell area and one of the second regions of the edge area. The coupling element is adapted to electrically couple the at least one of the second portions of the cell area and the one of the second portions of the edge area at least in a first state. The coupling element may be one of the coupling elements of FIG. 3A to 3B, 4A to 4B, 5A to 5B, or 6A to 6B.

Figure 7A:
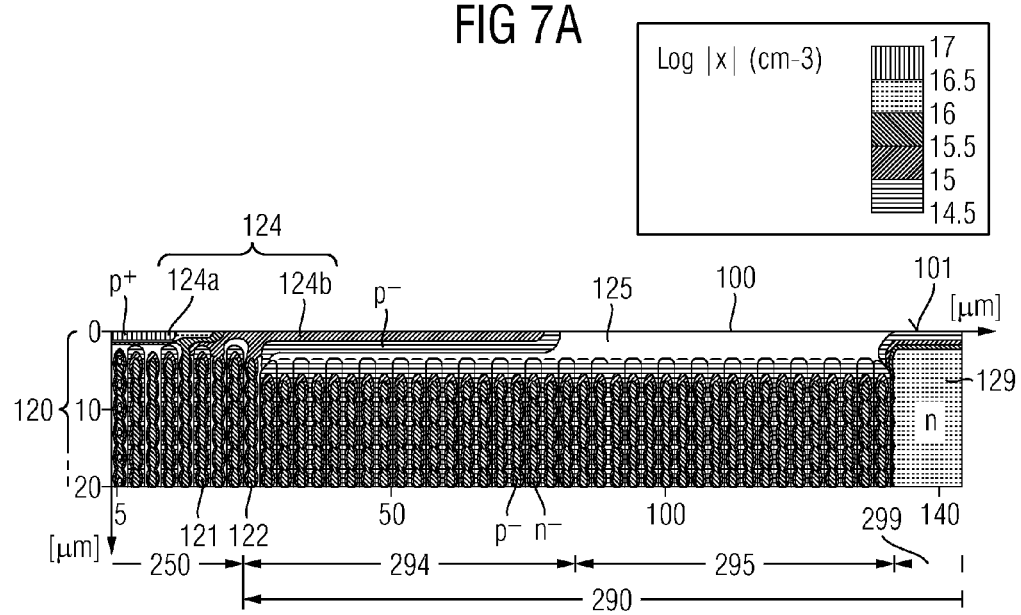
FIG. 7A is a schematic cross-sectional view of an edge area of a semiconductor body of a super junction semiconductor device according to an embodiment providing a junction termination zone.
Figure 7B:
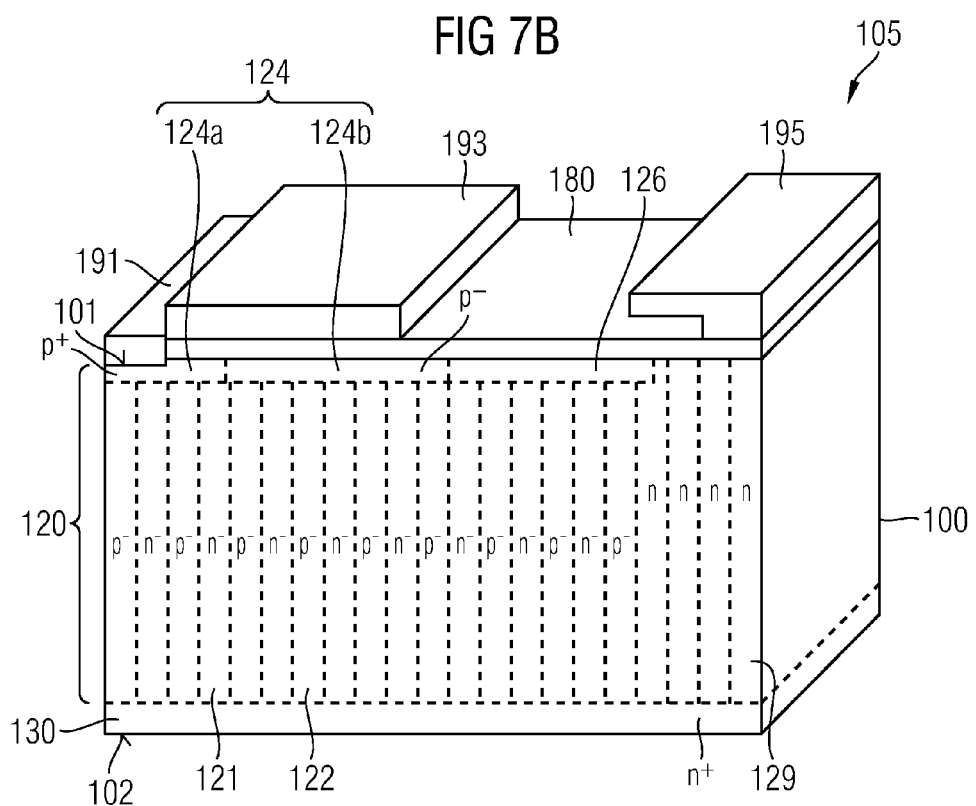
FIG. 7B is a schematic perspective view of a section of an edge area of a super junction semiconductor device in accordance with an embodiment providing a shallow edge implant zone.

FIGS. 7A and 7B refer to an embodiment of the super junction semiconductor device with a drift layer 120 formed in a semiconductor body 100 between a first surface 101 and a doped layer 130 of the first conductivity type. The drift layer 120 includes first regions 121 of the first conductivity type and second regions 122 of the second conductivity type, which is the opposite of the first conductivity type. The first and second regions 121, 122 are stripe-shaped and alternatingly arranged to form a regular stripe pattern. An edge area 290 surrounds a cell area 210 that includes doped zones adjoining to the first surface 101.

In the edge area 290, the first and second regions 121, 122 are formed at a first distance to the first surface 101. In the case the first and second regions 121, 122 are formed by implants during or after an epitaxial growth of the drift layer 120, the implants provided close to the first surface 101 are not performed, for example the implant closest to the first surface 101, the two implants, or the three implants closest to the first surface 101. According to an embodiment, the first distance is equal to or greater than half of a mean distance between neighboring first regions 121 in the cell area 210.

FIG. 7B shows a semiconductor die 105 with a first field plate 195 and a second field plate 193 provided in the edge area 290 outside a contour of the semiconductor body 100. A dielectric layer 180 separates the first and the second field plates 195, 193 from the semiconductor body 100. The first field plate 195 may be a drain field plate and the second field plate 193 may be a gate field plate or a source field plate. Though the edges of the field plates 193, 195 push the electrical field away from the first surface 101, the electrical field still has its maximum values close to the first surface 101. Providing the first and second regions 121, 122 at a sufficient distance to the first surface 101 reduces the maximum electrical field strength along the interface between the semiconductor body 100 and the dielectric layer 180. A minimum breakdown voltage of the edge area 290 is increased.

According to the illustrated embodiment, a junction termination zone 124 of the second conductivity type may be formed between the first surface 101 and the first and second regions 121, 122 at least in a transition area 250. The transition area 250 separates the cell area 210 and the edge area 290. In the transition area 250, a first portion 124a of the junction termination zone 124 directly adjoins to the first surface 101. The junction termination zone 124 may include a second portion 124b in an inner portion 294 of the edge area 290. The inner portion 294 of the edge area 290 directly adjoins to the transition area 250. The second portion 124b of the junction termination zone 124 is formed between the first surface 101 and those first and second regions 121, 122 formed at the first distance to the first surface 101. A net dopant concentration of the second conductivity type is lower in the second portion 124b of the junction termination zone 124 than in the first portion 124a. In other embodiments, the inner portion 294 and the second portion 124b of the junction termination zone 124 may be absent.

The edge area 290 further includes an outer portion 299. The outer portion 299 extends along an edge of the semiconductor die 105. In the outer portion 299, second regions 122 of the second conductivity type are absent and only impurities of the first conductivity type are implanted, for example in one, two or more parallel stripes having the same widths to form a frame-like circumferential implant zone 129. The dopant concentration in the circumferential implant zone 129 may be higher than that in the first regions 121 or other portions of the edge area 290. In a portion close to the first surface 101 the impurity concentration in the circumferential implant zone 129 decreases with decreasing distance to the first surface 101. For example, among a sequence of implants for forming the circumferential implant zone 129 the implant closest to the first surface 101, the two implants closest to the first surface 101 or more of the implants closest to the first surface 101 are not performed.

According to the embodiment of FIG. 7A an approximately intrinsic zone 125 is formed in a central portion 295 of the edge area 290 between the transition area 250 or the inner portion 294 and the outer portion 299 of the edge area 290. According to the embodiment of FIG. 7B, a shallow edge implant zone 126 is provided in the central portion 295 between the junction termination zone 124 and the circumferential implant zone 129. The impurity concentration of the shallow edge implant zone 126 may be in the range of $10^{15}$ cm$^{-3}$ to $10^{16}$ cm$^{-3}$, by way of example.

The shallow edge implant zone 126 is of the first conductivity type and adjoins directly to the first surface 101 in the edge area 290. According to the embodiment of FIG. 7B, the shallow edge implant zone 126 is formed in a lateral direction of the junction termination zone 124 and the shallow edge implant zone 126 does not overlap the junction termination zone 124. According to other embodiments, the shallow edge implant zone 126 at least partially overlaps with the junction termination zone 124 in the edge area 290. According to an embodiment, the shallow edge implant zone 126 is formed in the central portion 295 of the edge area 290 between an inner portion 294 and an outer portion 299, wherein in the inner portion 294 the junction termination zone 124 adjoins the first surface 101.

Figure 7C:
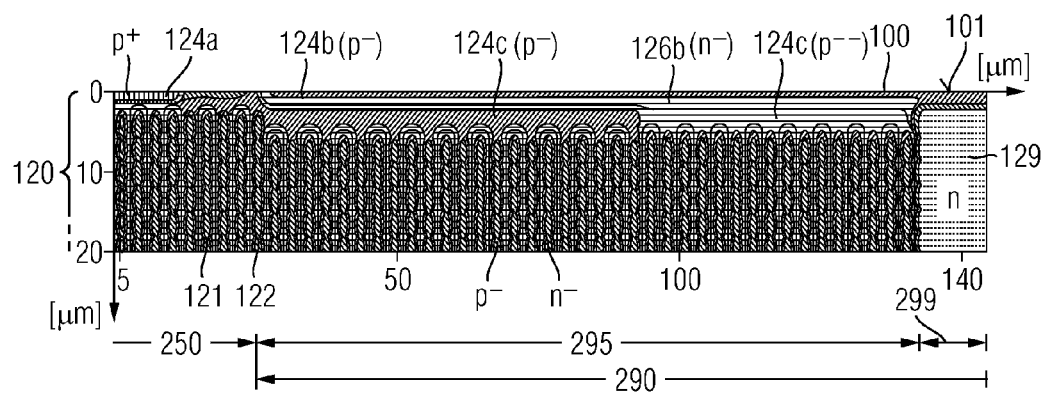
FIG. 7C is a schematic cross-sectional view of an edge area of a semiconductor body of a super junction semiconductor device in accordance with an embodiment providing a buried extension of a junction termination zone.

According to the embodiment illustrated in FIG. 7C, the shallow edge implant zone 126 is formed in the central portion 295 between an area, where the junction termination zone 124 adjoins the first surface 101, and extends into the outer portion 299. The area where the junction termination zone 124 adjoins the first surface 101 may be the transition area 250 or the inner portion 294 of the edge area 290.

A third, buried portion 124c of the junction termination zone 124 is formed in the central portion 295 between the shallow edge implant zone 126 and the first and second regions 121, 122 formed at the first distance to the first surface 101. The third section 124c of the junction termination zone 124 may include a first sub-section oriented to the cell area 210 and having a higher dopant concentration than a second sub-section oriented to the outer portion 299. By way of example, the net dopant concentration may be between $10^{15}$ cm$^{-3}$ and $10^{16}$ cm$^{-3}$ in the first sub-section and between $10^{14}$ cm$^{-3}$ and $10^{15}$ cm$^{-3}$ in the second sub-section. The shallow edge implant zone 126 may extend with a uniform first overlap into the outer portion 299 of the edge area 290, wherein for the circumferential implant zone 129, one or more implants closest to the first surface 101 are not performed.

Figure 7D:
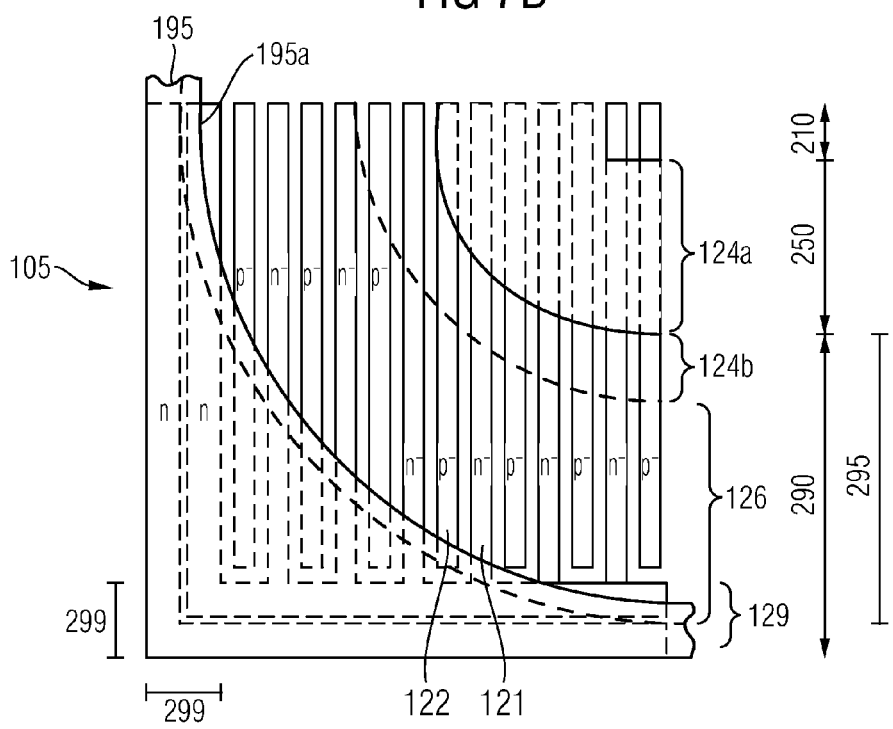
FIG. 7D is a schematic plan view of a corner section of a semiconductor die of a super junction semiconductor device in accordance with an embodiment providing a field electrode with a curved inner edge.

FIG. 7D shows a circumferential implant zone 129 that surrounds the first and second regions 121, 122 in the outer portion 299 of the edge area 290. A frame-like field plate 195 is arranged at a distance to the first surface 101 in the outer portion 299 outside the semiconductor body 100. The shallow edge implant zone 126 may have a uniform overlap with the field plate 195 in the vertical direction defined by the normal to the first surface 101. According to the illustrated embodiment, the frame-like field plate 195 has an inner edge 195*a* with a corner portion corresponding to a corner of the first surface 101 of the semiconductor die 105. The corner portion of the inner edge 195*a* in substance has an approximately "concave" shape, i.e. the inner edge 195*a* cuts a corner formed by orthogonal sections of the field plate 195. For example, the corner portion is a segment of a circle. A portion of the edge area 290, where the first and second regions 121, 122 are formed at the first distance to the first surface 101, which may be greater than the distance between neighboring first regions 121 in the cell area 210, may have a uniform width resulting in a uniform overlap with the first field plate 195 even in the corners of the semiconductor die 105. Further, the second portion 124*b* of the shallow edge implant zone 124 may have a uniform width.

According to the embodiment of FIG. 8A before any tempering, the circumferential implant zone 129 formed by the implant process includes parallel stripes of uniform width and has an inner edge 129*a* oriented to the cell area 210. The inner edge 129*a* includes corner portions corresponding to the corners of the first surface 101 of the semiconductor die 105. Each corner portion has an approximately "concave shape" with the inner edge 129*a* cutting a corner formed by orthogonal sections of the circumferential implant zone 129. For example the corner portion is a segment of a circle, for example a quadrant. The first regions 121 of the edge area 290 are interconnected with the circumferential implant zone 129. The minimum distances between each of the second regions 122 and the circumferential implant zone 129 are equal.

Corners of the second regions 122 oriented to the circumferential implant zone 129 are positioned along a first line 128*a* forming a quadrant having a uniform distance to the circumferential implant zone 129. Before a first tempering or anneal, the distance between the first line 128*a* and the circumferential implant zone 129 may be the same as a distance between the circumferential implant zone 129 and the neighboring second regions 122 in sections, where the two structures run parallel or orthogonal to each other. After outdiffusion of the implanted impurities from the implant zones 129 during subsequent heat treatments like, e.g. tempering or annealing, the uniform distances result in uniform impurity concentration transitions between the impurity zones resulting from the first lines 128*a* and the impurity zones resulting from the circumferential implant zone 129.

The embodiment of FIG. 8B differs from the embodiment of FIG. 8A in that after the implant and before any heat treatment each corner portion of the inner edge 195*a* has a first portion forming a segment of a circle and a second, straight portion running oblique to orthogonal portions of the circumferential implant zone 129. The first portion joins to a portion of the inner edge 195*a* running orthogonal to the first and second regions 121, 122 and the second portion joins to a portion of the inner edge 195*a* running parallel to the first and second regions 121, 122. In other words, with regard to a corner 127 of the cell area 210, a circumferential implant zone 129 running parallel to the first and second regions 121, 122 runs straight until a first angle β1. The straight portion of a corner portion joins at a slope angle of β2–β1 and at a second angle of β2, joins in the first portion of the corner portion forming a segment of circle. The second regions 122 are extended in the direction of the corner 127 accordingly. Again, the minimum distances between each of the second regions 122 and the circumferential implant zone 129 are equal. The second angle β2 may be between 40 and 50 degrees, for example 45 degrees. The first angle β1 may be between 20 and 25 degrees, for example 22.5 degrees.

While in the embodiment of FIG. 8A a second region 122 is absent in a first area 119, the embodiment of FIG. 8B avoids areas with missing second regions 122 or reduces such areas. Hence, the embodiment of FIG. 8B avoids an increase of local electrical field strength in areas where the second regions 122 are missing as counterparts to the first regions 121. According to other embodiments, the circumferential implant has a stepped inner edge 195*a* in the corner portions, wherein the lengths of the second regions 122 are adapted accordingly.

According to the embodiments of FIGS. 7A to 7D and 8A to 8B, the first and second regions 121, 122 have the same impurity concentration profiles and widths in the edge area 290 and in the cell area 210.

The embodiment of FIG. 9A differs from the embodiment of FIG. 7C in that the widths of the openings in implant masks defining the first and second regions 121, 122 are reduced in steps in the transition area 250 from a first width in the cell area 210 to a second width in the edge area 290. The second width is narrower than the first width by at least 10% of the first width. A reduction of the widths of the openings in the implant mask by 10% corresponds to a reduction of the impurity quantity or dopant level by 10%. The widths are narrowed from region to region in sections of the transition area 250 parallel to the first and second regions 121, 122. The widths are narrowed along the length extension of the first and second regions 121, 122 in sections of the transition area 250 orthogonal to the first and second regions 121, 122. The widths are narrowed according to both schemes in corner portions of the transition area 250 connecting orthogonal transition area sections at a slope angle of about 45 degrees. The width variations concerning the implanted areas result in corresponding impurity concentration and dopant level variations in the finalized device having been subjected to heat treatments during the manufacture process, e.g. annealing and tempering.

FIG. 9B combines the width variation scheme of FIG. 9A with the embodiment of FIG. 8B.

The width variation may result in that in the edge area 290 the breakdown voltage is higher than in the cell area 210 such that avalanche stability of the semiconductor device is improved. The width of the edge area 290 may be reduced which in turn enhances area efficiency of the device. According to an embodiment, the width is reduced from the width of the cell area 210 to the width in the edge area 290 in one single step within the transition area 250. For example, the width may be reduced to 80% of the width in the cell area 210. In accordance with another embodiment the width is reduced in more than one step, for example in at least four steps, each step reducing the widths by five percent of the width in the cell area 210. For example, the width reduction may be implemented by reducing the implant dose using the same mask or the same width for openings in an implant mask in the cell area 250 and the edge area 290.

Figure 9C:
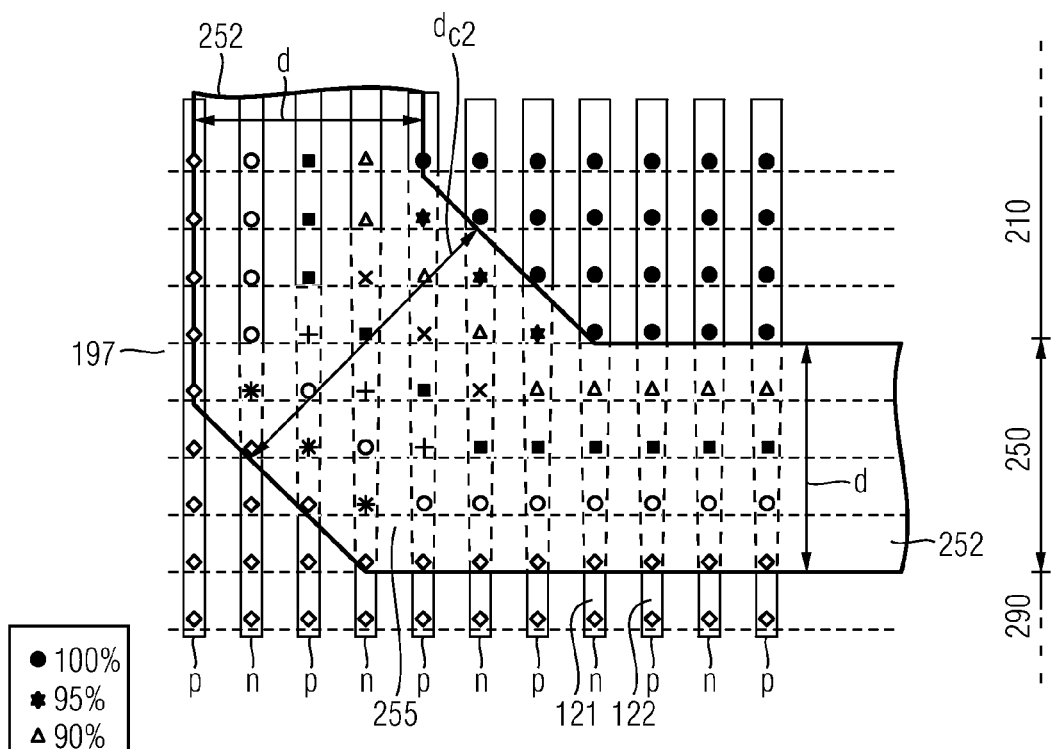
FIG. 9C is a schematic plan view of a section of a semiconductor die of a super junction semiconductor device in accordance with an embodiment providing a frame-like transition area having a corner portion which is wider than orthogonal portions.

According to the embodiment of FIG. 9C a corner portion 255 connects two orthogonal portions 252 of the transition area 250 at a slope angle of 45 degrees. The corner portion 255 has a width dc2 obtained by multiplying the width d of the orthogonal portions 252 with $\sqrt{2}$. The width is reduced at the same rate in the orthogonal portions 252 and along a diagonal direction in the corner portion 255.

Figure 9D:
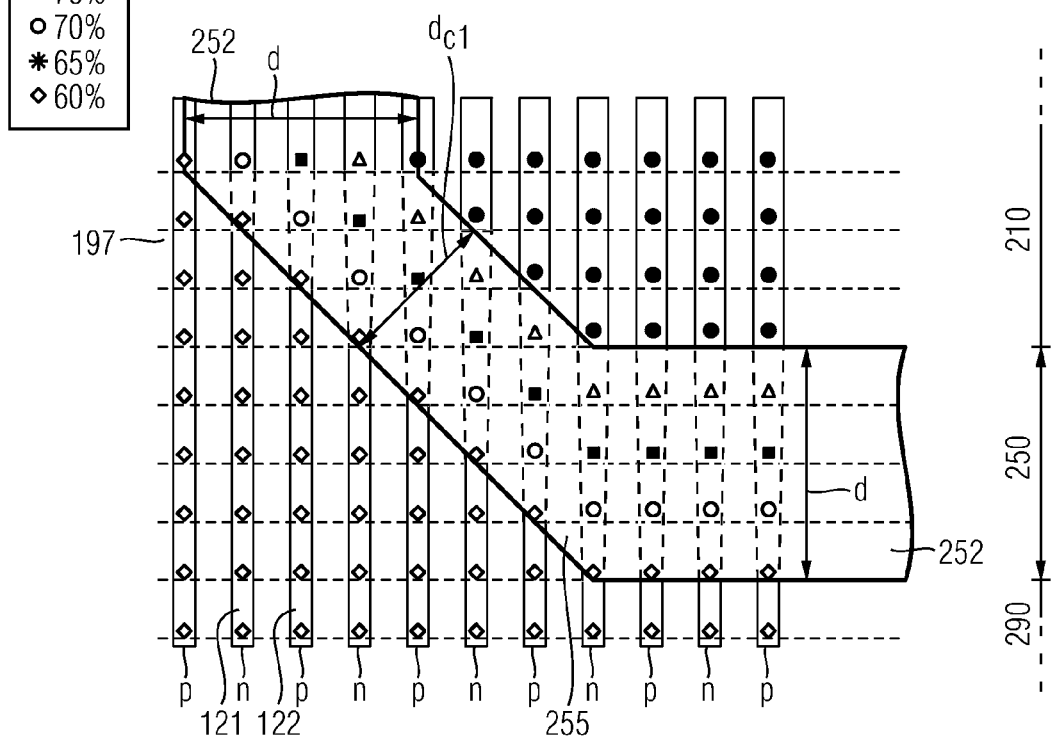
FIG. 9D is a schematic plan view of a corner section of a semiconductor die of a super junction semiconductor device in accordance with an embodiment related to a frame-like transition area having a corner portion which is narrower than orthogonal portions.

FIG. 9D shows a corner portion 255 of a transition area 250 connecting two orthogonal portions 252 of the transition area 250 at a slope angle of 45 degrees. The corner portion 255 has a width dc1 obtained by dividing the width d of the orthogonal portions 252 by $\sqrt{2}$. The width of the first and second regions 121, 122 can be reduced at the same rate by the same number of steps within the transition area 250 in the orthogonal directions in both the orthogonal and the corner portions 252, 255. Since the area portion with higher absolute impurity concentrations is lower in the embodiment of FIG. 9D, a breakdown voltage or avalanche stability may be increased compared to the embodiment of FIG. 9D.

Figure 10A:
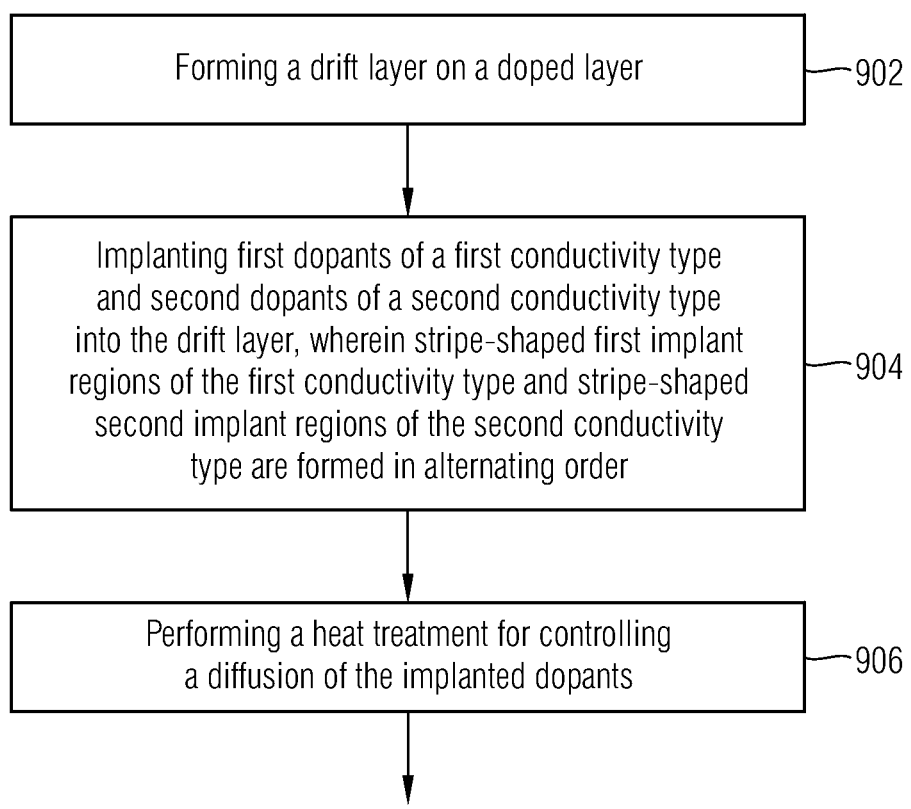
FIG. 10A is a schematic flow-chart of a method of manufacturing a super junction semiconductor device in accordance with a further embodiment.

FIG. 10A relates to a method of manufacturing a super junction semiconductor device. At least a portion of a drift layer is formed on a doped layer of a first conductivity type (902). First dopants of a first conductivity type and second dopants of a second conductivity type are implanted into the drift layer using one or more implant masks with openings, wherein stripe-shaped first implant regions of the first conductivity type and stripe-shaped second implant regions of the second conductivity type are formed in alternating order (904). A heat treatment is performed for controlling a diffusion of the implanted first and second dopants from the implant regions to form stripe-shaped first regions of the first conductivity type and stripe-shaped second regions of the second conductivity type (906).

According to an embodiment, the diffusion is controlled such that neighboring first and second regions directly adjoin to each other.

According to an embodiment, a circumferential implant zone of the first conductivity type is provided that encloses the first and second regions. According to an embodiment the circumferential implant zone includes one or more parallel stripes.

According to an embodiment, the stripe-shaped first implant regions of the first conductivity type are provided longer than the stripe-shaped second implant regions.

According to an embodiment, the stripe-shaped first implant regions of the first conductivity type are provided to be connected with the implant region of the circumferential implant zone.

According to an embodiment, the stripe-shaped second implant regions of the second conductivity type are provided to be separated from the implant region of the circumferential implant zone.

According to an embodiment, the implant region of the circumferential implant zone is provided wider than the first and second implant regions resulting in a higher effective doping concentration in the circumferential implant zone. The combination of shorter second regions and the higher doped circumferential implant zone results in a local excess of dopants of the first conductivity type which reduces the electric field strength at the outmost pn junction. As a result the breakdown voltage of the edge area is increased.

Figure 10B:
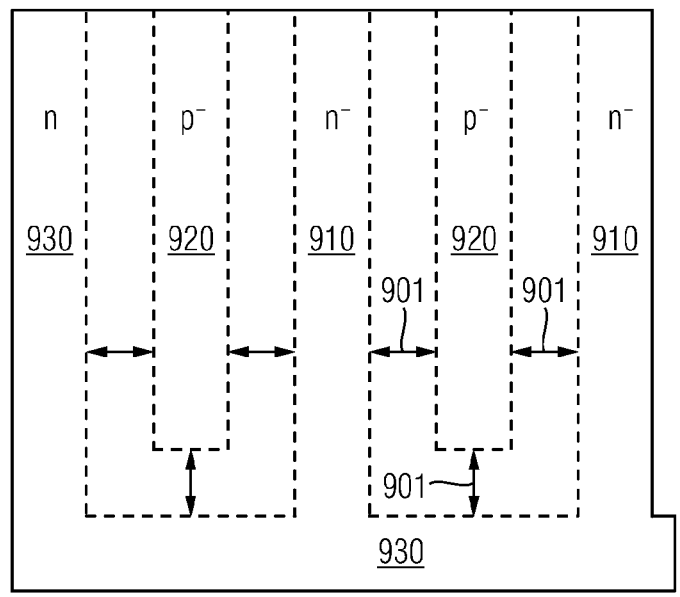
FIG. 10B is a schematic plan view superposing mask openings for illustrating an embodiment concerning the manufacturing of a super junction semiconductor device.

FIG. 10B superposes first mask openings 910 for the stripe-shaped first implant regions of the first conductivity type, second mask openings 920 for the stripe-shaped second implant regions and third mask openings 930 for the circumferential implant zone. The mask openings 910, 920, 930 may be formed in one mask or in different masks. For example the first mask openings 910 may be formed in a first mask and the second and third mask openings 920, 930 may be formed in a second mask. The masks are aligned such that the implant regions of the first conductivity type are separated from the implant regions of the second conductivity type at uniform distances 901.

Figure 10C:
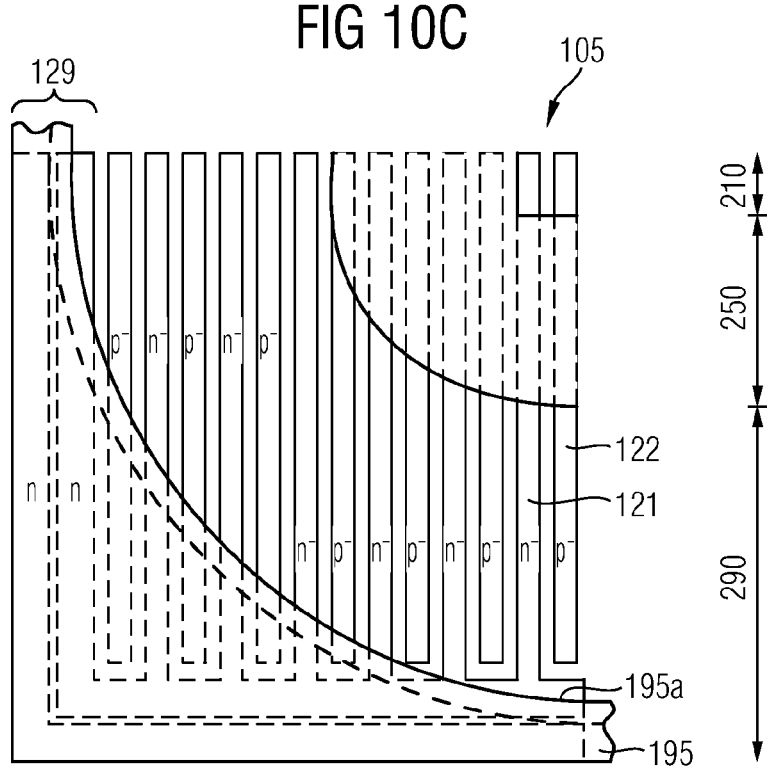
FIG. 10C is a schematic cross-sectional view of an edge area of a semiconductor body of a super junction semiconductor device in accordance with an embodiment providing a field plate.

According to the embodiment of FIG. 10C, a frame-like field plate 195 is provided that has an inner edge 195a with a corner portion corresponding to a corner of a first surface 101 of a semiconductor die 105. The corner portion of the inner edge 195a in substance has an approximately "concave" shape, i.e. the inner edge 195a cuts a corner formed by orthogonal sections of the field plate 195. For example, the corner portion is a segment of a circle or a quadrant. the frame-like field plate 195 concentrates the electric field along the bowed inner edge 195a and prevents possible excess field strengths in the edges of the semiconductor die 105.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a super junction semiconductor device, the method comprising:
    forming at least a portion of a drift layer on a doped layer of a first conductivity type;
    implanting first dopants of a first conductivity type and second dopants of a second conductivity type into the drift layer using one or more implant masks with openings to form stripe-shaped first implant regions of the first conductivity type, stripe-shaped second implant regions of the second conductivity type in alternating order and a circumferential implant zone of the first conductivity type that encloses the stripe-shaped first and second regions, wherein the stripe-shaped second implant regions are separated from the stripe-shaped first implant regions and from the circumferential implant zone at uniform distances;
    performing a heat treatment for controlling a diffusion of dopants from the implant regions to form stripe-shaped first regions of the first conductivity type and stripe-shaped second regions of the second conductivity type.

2. The method of claim 1, wherein the diffusion is controlled such that neighboring ones of the stripe-shaped first and second regions directly adjoin each other.

3. The method of claim 1, wherein the stripe-shaped first implant regions are formed longer than the stripe-shaped second implant regions.

4. The method of claim 1, wherein the circumferential implant zone includes one stripe or two or more parallel stripes.

5. The method of claim 1, wherein the stripe-shaped first implant regions are formed connected with the implant region of the circumferential implant zone.

6. The method of claim 1, wherein the stripe-shaped second implant regions are formed separated from the implant region of the circumferential implant zone.

7. The method of claim 1, wherein the implant region of the circumferential implant zone is formed wider than the stripe-shaped first and second implant regions resulting in a higher effective doping concentration in the circumferential implant zone.

8. The method of claim 1, wherein the circumferential implant zone of the first conductivity type surrounds the stripe-shaped first and second regions in an outer portion of an edge area devoid of the stripe-shaped second regions, the outer portion adjoining an edge of a semiconductor body that comprises the drift layer, wherein the circumferential implant zone has an inner edge comprising a corner portion corresponding to a corner of the semiconductor body, the corner portion having a concave shape, and wherein minimum distances between each of the stripe-shaped second regions and the circumferential implant zone are equal.

9. The method of claim 8, wherein the corner portion comprises a first portion forming a segment of a circle and a second, straight portion slanted to orthogonal portions of the circumferential implant zone, the first portion joining to a portion of the inner edge running orthogonal to the stripe-shaped first and second regions and the second portion joining to a portion of the inner edge running parallel to the stripe-shaped first and second regions.

10. The method of claim 8, wherein the stripe-shaped first and second regions each have lower dopant levels in the edge area than in the cell area by at least 10%.

11. The method of claim 8, wherein the dopant levels of the stripe-shaped first and second regions are reduced in steps in a transition area between the edge area and a cell area that includes doped zones adjoining to a first surface, and wherein the dopant levels are reduced from first dopant levels in the cell area to second dopant levels in the edge area, the second dopant levels being at least 10% lower than the first dopant levels.

12. The method of claim 11, wherein the transition area has a corner portion connecting two orthogonal portions of the transition area at a slope angle of 45 degrees, the corner portion having a width which is the width of the orthogonal portions divided by $\sqrt{2}$, and wherein dopant levels of the stripe-shaped first and second regions are reduced at the same rate in orthogonal direction in the orthogonal and the corner portions.

13. The method of claim 1, wherein the diffusion is controlled such that neighboring ones of the stripe-shaped first and second regions remain separated from each other.

* * * * *